(12) United States Patent
Sudo

(10) Patent No.: US 11,070,212 B2
(45) Date of Patent: Jul. 20, 2021

(54) OSCILLATOR, ELECTRONIC APPARATUS AND VEHICLE

(71) Applicant: SEIKO EPSON CORPORATION, Tokyo (JP)

(72) Inventor: Yasuhiro Sudo, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/809,186

(22) Filed: Mar. 4, 2020

(65) Prior Publication Data
US 2020/0287552 A1 Sep. 10, 2020

(30) Foreign Application Priority Data
Mar. 5, 2019 (JP) .............................. JP2019-039137

(51) Int. Cl.
| | | |
|---|---|---|
| *H03L 1/02* | (2006.01) | |
| *G04F 10/00* | (2006.01) | |
| *G06N 20/00* | (2019.01) | |
| *G06F 1/06* | (2006.01) | |
| *H03M 1/66* | (2006.01) | |

(52) U.S. Cl.
CPC ............. *H03L 1/02* (2013.01); *G04F 10/005* (2013.01); *G06F 1/06* (2013.01); *G06N 20/00* (2019.01); *H03M 1/66* (2013.01)

(58) Field of Classification Search
CPC ....................................................... H03L 1/02
USPC ........................................................ 331/66
See application file for complete search history.

(56) References Cited

U.S. PATENT DOCUMENTS

| | | |
|---|---|---|
| 5,214,668 A | 5/1993 | Satou et al. |
| 7,545,228 B1 | 6/2009 | Lu et al. |
| 10,247,621 B1 | 4/2019 | Partridge et al. |
| 2007/0247246 A1 | 10/2007 | Hagelin |
| 2007/0290764 A1 | 12/2007 | Partridge et al. |
| 2012/0194277 A1 | 8/2012 | Akaike et al. |

(Continued)

FOREIGN PATENT DOCUMENTS

| | | |
|---|---|---|
| JP | H04-363913 A | 12/1992 |
| JP | 2012-170050 A | 9/2012 |
| JP | 2014-116791 A | 6/2014 |

OTHER PUBLICATIONS

Esterline, John C., "Temperature Compensation of Crystal Oscillators Using an Artificial Neural Network," Greenray Industries, 2012, 7 pages.

*Primary Examiner* — Joseph Chang
(74) *Attorney, Agent, or Firm* — Rankin, Hill & Clark LLP

(57) ABSTRACT

Provided is an oscillator including: a first resonator; a second resonator; a first oscillation circuit generating a first oscillation signal by oscillating the first resonator; a second oscillation circuit generating a second oscillation signal that has frequency-temperature characteristics different from frequency-temperature characteristics of the first oscillation signal by oscillating the second resonator; a clock signal generation circuit generating a clock signal with a frequency that is temperature compensated by temperature compensation data; and a processing circuit performing time digital conversion processing based on the first oscillation signal and the second oscillation signal, and obtaining the temperature compensation data based on measurement data of the time digital conversion processing.

11 Claims, 17 Drawing Sheets

(56) References Cited

U.S. PATENT DOCUMENTS

| | | | |
|---|---|---|---|
| 2013/0038397 A1* | 2/2013 | Kobayashi | H03L 1/02 |
| | | | 331/46 |
| 2013/0041859 A1 | 2/2013 | Esterlilne | |
| 2014/0159821 A1 | 6/2014 | Yorita | |
| 2014/0337261 A1 | 11/2014 | Esterline | |
| 2015/0142715 A1 | 5/2015 | Esterline et al. | |
| 2018/0091156 A1* | 3/2018 | Maki | H03B 5/362 |

\* cited by examiner

OSCILLATOR, ELECTRONIC APPARATUS AND VEHICLE

The present application is based on, and claims priority from JP Application Serial Number 2019-039137, filed Mar. 5, 2019, the disclosure of which is hereby incorporated by reference herein in its entirety.

BACKGROUND

1. Technical Field

The present disclosure relates to an oscillator, an electronic apparatus, a vehicle and the like.

2. Related Art

In the related art, a temperature compensated oscillator that performs temperature compensation based on a temperature detection result is known. As such a temperature compensated oscillator, for example, the related art disclosed in JP-A-4-363913 is known. JP-A-4-363913 discloses a temperature compensated oscillator that performs temperature compensation by detecting a temperature change from a frequency difference between oscillations of two resonators.

The oscillator described in JP-A-4-363913 has a configuration in which two oscillation signals are input to a counter to obtain a frequency difference, and thus there is a problem that it takes a long measurement time to measure temperature with high accuracy.

SUMMARY

An aspect of the present disclosure relates to an oscillator including: a first resonator; a second resonator; a first oscillation circuit generating a first oscillation signal by oscillating the first resonator; a second oscillation circuit generating a second oscillation signal that has frequency-temperature characteristics different from frequency-temperature characteristics of the first oscillation signal by oscillating the second resonator; a clock signal generation circuit generating a clock signal with a frequency that is temperature compensated by temperature compensation data; and a processing circuit performing time digital conversion processing based on the first oscillation signal and the second oscillation signal, and obtaining the temperature compensation data based on measurement data of the time digital conversion processing.

DESCRIPTION OF EXEMPLARY EMBODIMENTS

Hereinafter, the present embodiment will be described. Note that the present embodiment to be described below does not unduly limit the contents of the disclosure described in the appended claims. In addition, all configurations to be described in the present embodiment are not limited to being essential constituent conditions.

1. Oscillator

Figure 1:
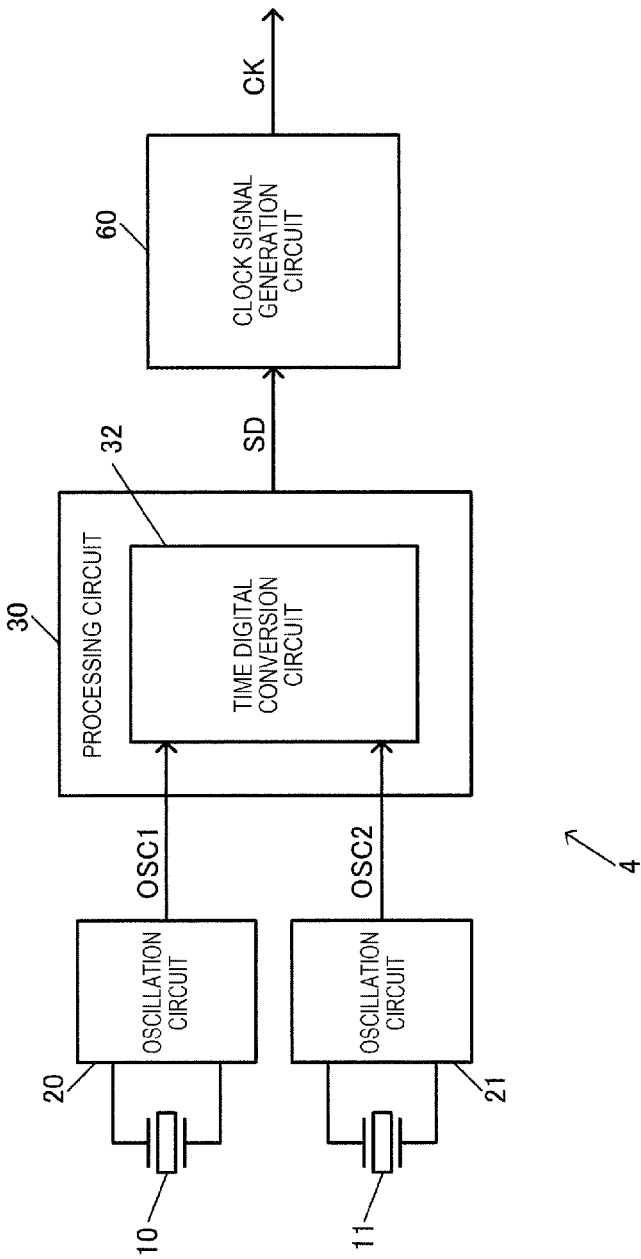
FIG. 1 shows a configuration example of an oscillator according to the present embodiment.

FIG. 1 shows a configuration example of an oscillator 4 according to the present embodiment. The oscillator 4 is a temperature compensated oscillator and includes resonators 10 and 11, oscillation circuits 20 and 21, a processing circuit 30, and a clock signal generation circuit 60. The oscillator 4 may be a temperature compensated crystal oscillator (TCXO) that does not include a constant temperature oven, or may be a constant temperature oven controlled crystal oscillator (OCXO) that includes a constant temperature oven. The resonator 10 is a first resonator, and the resonator 11 is a second resonator. The oscillation circuit 20 is a first oscillation circuit, and the oscillation circuit 21 is a second oscillation circuit. In the present embodiment, the oscillation circuits 20 and 21, the processing circuit 30, and the clock signal generation circuit 60 can be provided in a circuit device. The circuit device is a semiconductor chip in which circuit elements are formed on a semiconductor substrate. Alternatively, the oscillation circuits 20 and 21 may be provided in a first circuit device that is a first semiconductor chip, and the processing circuit 30 and the clock signal generation circuit 60 may be provided in a second circuit device that is a second semiconductor chip. The resonator 10 is electrically coupled to the oscillation circuit 20, and the resonator 11 is electrically coupled to the oscillation circuit 21. For example, the resonators 10, 11 and the oscillation circuits 20, 21 are electrically coupled to each other via a bonding wire, a metal bump, an internal wiring of a package, or the like.

The resonator 10 and 11 are an element generating mechanical vibration by an electric signal. The resonators 10 and 11 can be realized by a resonator element such as a quartz crystal resonator element, for example. For example, the resonators 10 and 11 can be realized by a quartz crystal resonator element in which a cut angle vibrates in a thickness-slide manner such as an AT cut or a SC cut. Note that the resonators 10 and 11 according to the present embodiment can be realized by various resonator elements such as resonator elements other than a thickness-slide vibration type or piezoelectric resonator elements formed of materials other than quartz crystal. For example, as the resonators 10 and 11, a surface acoustic wave (SAW) resonator, a micro electro mechanical systems (MEMS) resonator as a silicon resonator formed using a silicon substrate, or the like may be adopted.

For example, the oscillator 4 includes a package in which the resonators 10 and 11, and the circuit device are accommodated. In this case, the circuit device that is a semiconductor chip includes the oscillation circuits 20 and 21, the processing circuit 30, and the clock signal generation circuit 60. The package is made of, for example, ceramic or the like, and has an accommodation space inside thereof. For example, the package includes a base and a lid, and the lid is bonded to the upper surface of the base so as to form an accommodation space between the base and the lid. In this way, the resonators 10 and 11, and the circuit device are accommodated in the accommodation space hermetically sealed by the base and the lid. In this case, the resonators 10 and 11 are, for example, arranged adjacent to each other inside the package of the oscillator 4. For example, the resonators 10 and 11 are arranged adjacent to each other on one substrate. For example, the resonators 10 and 11 are arranged so as to be temperature coupled. Thereby, the temperature environment around the resonators 10 and 11 can be made the same temperature environment. Alternatively, the oscillator 4 may include a first package in which the resonators 10 and 11, and the first circuit device are accommodated, and a second package in which the first package and the second circuit device are accommodated. In this case, the first circuit device that is the first semiconductor chip includes the oscillation circuits 20 and 21, and the second circuit device that is the second semiconductor chip includes the processing circuit 30 and the clock signal generation circuit 60. The resonators 10 and 11 are arranged so as to be adjacent to each other inside the first package of the oscillator 4, for example, so as to be temperature coupled.

The oscillation circuit 20 generates the oscillation signal OSC1 by causing the resonator 10 to oscillate. The oscillation circuit 21 generates the oscillation signal OSC2 by causing the resonator 11 to oscillate. The oscillation signal OSC1 is a first oscillation signal, and the oscillation signal OSC2 is a second oscillation signal. The oscillation signals OSC1 and OSC2 can also be called oscillation clock signals. For example, the oscillation signal OSC2 is an oscillation signal having frequency-temperature characteristics different from that of the oscillation signal OSC1. For example, in the present embodiment, the resonators 10 and 11 have different frequency-temperature characteristics of oscillation. As described above, the frequency-temperature characteristics of the resonators 10 and 11 are different, so that the frequency-temperature characteristics of the oscillation signals OSC1 and OSC2 are also different. For example, the frequency-temperature characteristics of the resonators 10 and 11 can be made different by making a cut angle for an AT cut of the resonator 10 different from a cut angle of the resonator 11. Alternatively, either one of the AT cut and the Y cut may be used as the resonator 10, and the resonator of the other cut may be used as the resonator 11. Note that the method of making the frequency-temperature characteristics of the oscillation signals OSC1 and OSC2 different is not limited to the method described above, and various methods can be used.

Each of the oscillation circuits 20 and 21 includes an oscillation drive circuit provided between the first resonator terminal and the second resonator terminal. For example, each of the oscillation circuits 20 and 21 can be realized by a transistor such as a bipolar transistor that realizes a drive circuit and an active element such as a capacitor or a resistor. As the oscillation circuits 20 and 21, various types of oscillation circuits can be used such as a Pierce type, a Colpitts type, an inverter type, or a Hartley type. Further, a variable capacitance circuit may be provided in each of the oscillation circuits 20 and 21. When such a variable capacitance circuit is provided, the oscillation frequency can be adjusted by adjusting a capacitance value of the variable capacitance circuit. The variable capacitance circuit can be realized by a variable capacitance element such as a varactor. The variable capacitance circuit can be electrically coupled to one end of each resonator of the resonators 10 and 11.

Note that a first variable capacitance circuit coupled to one end of each resonator and a second variable capacitance circuit electrically coupled to the other end of each resonator may be provided. The oscillation signals OSC1 and OSC2 output from the oscillation circuits 20 and 21 are not limited to oscillation signals obtained directly by the oscillation of the resonators 10 and 11, and may be signals obtained by dividing the oscillation signals. Further, the coupling in the present embodiment is an electrical coupling. The electrical coupling is a coupling to which an electrical signal is transmittable, and a coupling that enables transmission of information by an electrical signal. The electrical coupling may be a coupling via an active element or the like.

The processing circuit 30 is a circuit that performs various processing in the oscillator 4. For example, the processing circuit 30 performs time digital conversion processing based on the oscillation signal OSC1 and the oscillation signal OSC2, and obtains temperature compensation data based on measurement data of the time digital conversion processing. The time digital conversion processing is processing for measuring a time difference between a plurality of edge timings of the same signal or a time difference between edge timings of a plurality of different signals, and obtaining digital measurement data corresponding to the time difference. The edge timing of signal is a transition timing of signal. For example, the processing circuit 30 performs the time digital conversion processing that converts time differences between the plurality of edge timings into digital measurement data, and obtains temperature compensation data based on the obtained measurement data. This time digital conversion processing is executed by the time digital conversion circuit 32.

Specifically, the processing circuit 30 measures a first time difference between a plurality of edge timings of the oscillation signal OSC1 and a second time difference between a plurality of edge timings of the oscillation signal OSC2. Then, the time digital conversion processing is performed to obtain data corresponding to a difference between the first time difference and the second time difference, or data of the first time difference and the second time difference as digital measurement data. The plurality of edges of the plurality of edge timings for which the time differences are obtained are, for example, a plurality of rising edges adjacent to each other, a plurality of falling edges adjacent to each other, or rising edges and falling edges adjacent to each other. Alternatively, the processing circuit 30 may measure a third time difference between the first edge timing of the oscillation signal OSC1 and a third edge timing corresponding to the oscillation signal OSC2, and measure a fourth time difference between the second edge timing of the oscillation signal OSC1 and the fourth edge timing corresponding to the oscillation signal OSC2. Then, the time digital conversion processing may be performed to obtain data corresponding to a difference between the third time difference and the fourth time difference, or data of the third time difference and the fourth time difference as digital measurement data. The edges of the oscillation signals OSC1 and OSC2 may be rising edges or falling edges. The processing circuit 30 obtains temperature compensation data based on measurement data of the time difference obtained by such time digital conversion processing. The temperature compensation is processing for suppressing and compensating the frequency fluctuation of the clock signal CK due to a temperature fluctuation. The processing circuit 30 can be realized, for example, by an application specific integrated circuit (ASIC) using automatic placement and wiring such as a gate array. Alternatively, the processing circuit 30 may be realized by a processor such as a digital signal processor (DSP) or a central processing unit (CPU).

The clock signal generation circuit 60 generates a clock signal CK with a frequency that is temperature compensated by the temperature compensation data. For example, the processing circuit 30 outputs setting data SD for setting the frequency and the like of the clock signal CK to the clock signal generation circuit 60. Specifically, the processing circuit 30 outputs setting data SD corrected by the temperature compensation data, and the clock signal generation circuit 60 generates a clock signal CK based on the setting data SD. For example, the clock signal generation circuit 60 generates the clock signal CK based on one of the oscillation signals OSC1 and OSC2, and the setting data SD. Since the setting data SD is data corrected by the temperature compensation data, the clock signal generation circuit 60 generates the clock signal CK based on the setting data SD, so that a clock signal CK with the frequency that is temperature compensated by the temperature compensation data can be generated.

Figure 2:
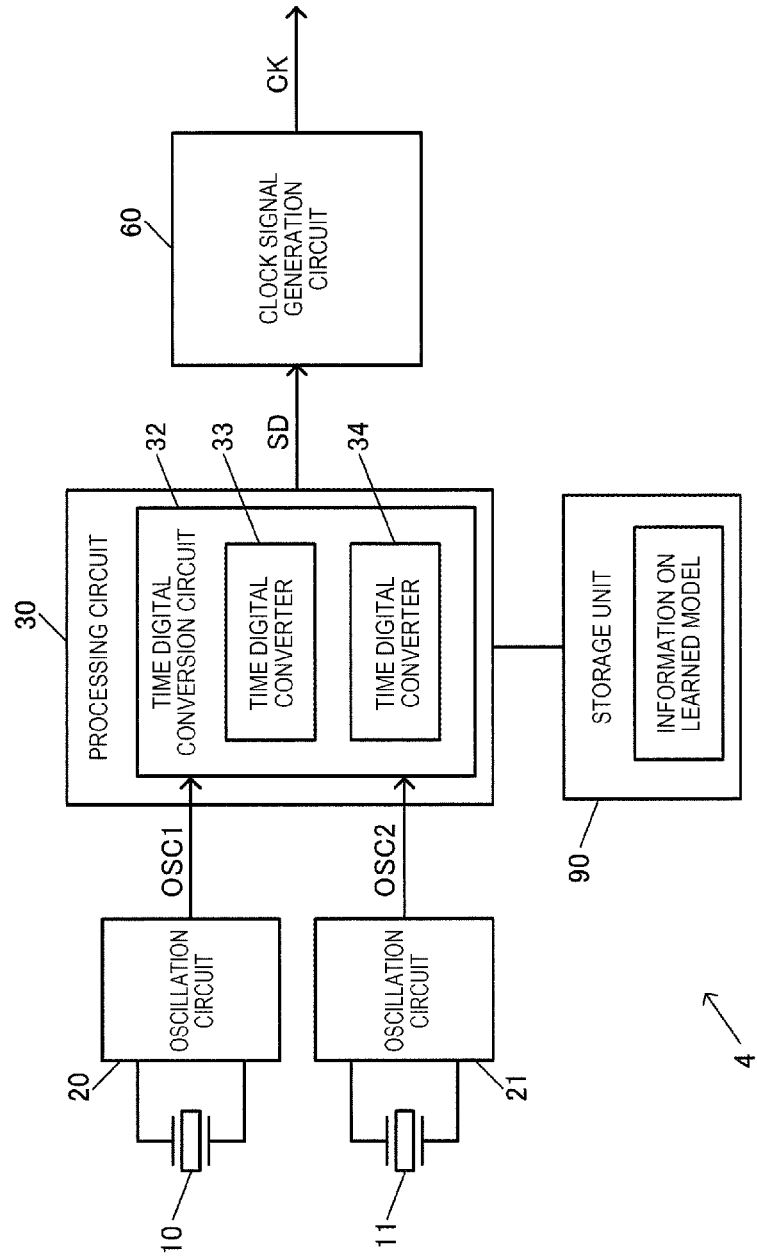
FIG. 2 shows a detailed configuration example of the oscillator according to the present embodiment.

FIG. 2 shows a detailed configuration example of the oscillator 4. In FIG. 2, the oscillator 4 includes a storage unit 90. The storage unit 90 stores information on a learned model. For example, the storage unit 90 stores the information on the learned model that is machine-learned so as to output data corresponding to the temperature compensation data with respect to input data. For example, when the processing circuit 30 performs the neural network calculation, the storage unit 90 stores information about the weighting coefficient of the neural network calculation as the information on the learned model. The data corresponding to the temperature compensation data may be the temperature compensation data itself or data for obtaining the temperature compensation data. The storage unit 90 can be realized by a semiconductor memory such as a non-volatile memory, for example. As the non-volatile memory, an electrically erasable programmable read-only memory (EEPROM) capable of electrical erasure of data, or an one time programmable (OTP) memory or the like using a floating gate avalanche injection MOS (FAMOS) or the like can be used.

The processing circuit 30 obtains the temperature compensation data by performing processing based on the information on the learned model stored in the storage unit 90. Specifically, the processing circuit 30 obtains the temperature compensation data by performing the processing based on the information on the learned model using the measurement data of time digital conversion processing as the input data. For example, the time digital conversion circuit 32 of the processing circuit 30 measures a time difference between a plurality of edge timings of the oscillation signal OSC1, a time difference between a plurality of edge timings of the oscillation signal OSC2, and a time difference between the edge timing of the oscillation signal OSC1 and the edge timing corresponding to the oscillation signal OSC2, and further, obtains digital measurement data based on the measured time differences. The processing circuit 30 obtains the temperature compensation data by performing the processing based on the information on the learned model such as neural network calculation using the measurement data as the input data. The processing circuit 30 outputs the setting data SD corrected by the obtained temperature compensation data to the clock signal generation circuit 60, and the clock signal generation circuit 60 generates the clock signal CK based on the setting data SD, so that a clock signal CK with the frequency that is temperature compensated by the temperature compensation data can be generated.

As described above, when the circuit device is accommodated in the package of the oscillator 4 together with the resonators 10 and 11, in addition to the oscillation circuits 20 and 21, the processing circuit 30, and the clock signal generation circuit 60, the storage unit 90 is also provided in the circuit device. On the other hand, when the first circuit device having the resonators 10 and 11, and the oscillation circuits 20 and 21 is accommodated in the first package of the oscillator 4 and the first package and the second circuit device are accommodated in the second package, in addition to the processing circuit 30 and the clock signal generation circuit 60, the storage unit 90 is also provided in the second circuit device.

In FIG. 2, the time digital conversion circuit 32 includes time digital converters 33 and 34. For example, the time digital converter 33 performs first time digital conversion processing, and the time digital converter 34 performs second time digital conversion processing. The time digital converter 33 performs first time digital conversion processing based on the oscillation signal OSC1, for example. For example, the first time digital conversion processing for measuring the first time difference between the plurality of edge timings of the oscillation signal OSC1 is performed. The oscillation signal OSC1 may be an oscillation signal obtained directly from the oscillation of the resonator 10, or an oscillation signal obtained by dividing the oscillation signal obtained by the oscillation of the resonator 10. For example, the oscillation circuit 20 outputs an oscillation signal OSC1 obtained by dividing by a built-in dividing circuit. The time digital converter 34 performs second time digital conversion processing based on the oscillation signal OSC2, for example. For example, the second time digital conversion processing for measuring the second time difference between the plurality of edge timings of the oscillation signal OSC2 is performed. The oscillation signal OSC2 may be an oscillation signal obtained directly from the oscillation of the resonator 11, or an oscillation signal obtained by dividing the oscillation signal obtained by the oscillation of the resonator 11. For example, the oscillation circuit 21 outputs an oscillation signal OSC2 obtained by dividing by a built-in dividing circuit.

In FIG. 2, a plurality of time digital converters 33 and 34 are provided in the processing circuit 30, but the present embodiment is not limited to this. For example, the processing circuit 30 may execute the first time digital conversion processing and the second time digital conversion processing in a time division manner. For example, the processing circuit 30 may execute the first time digital conversion processing based on the oscillation signal OSC1 and the second time digital conversion processing based on the oscillation signal OSC2 in a time division manner.

Figure 3:
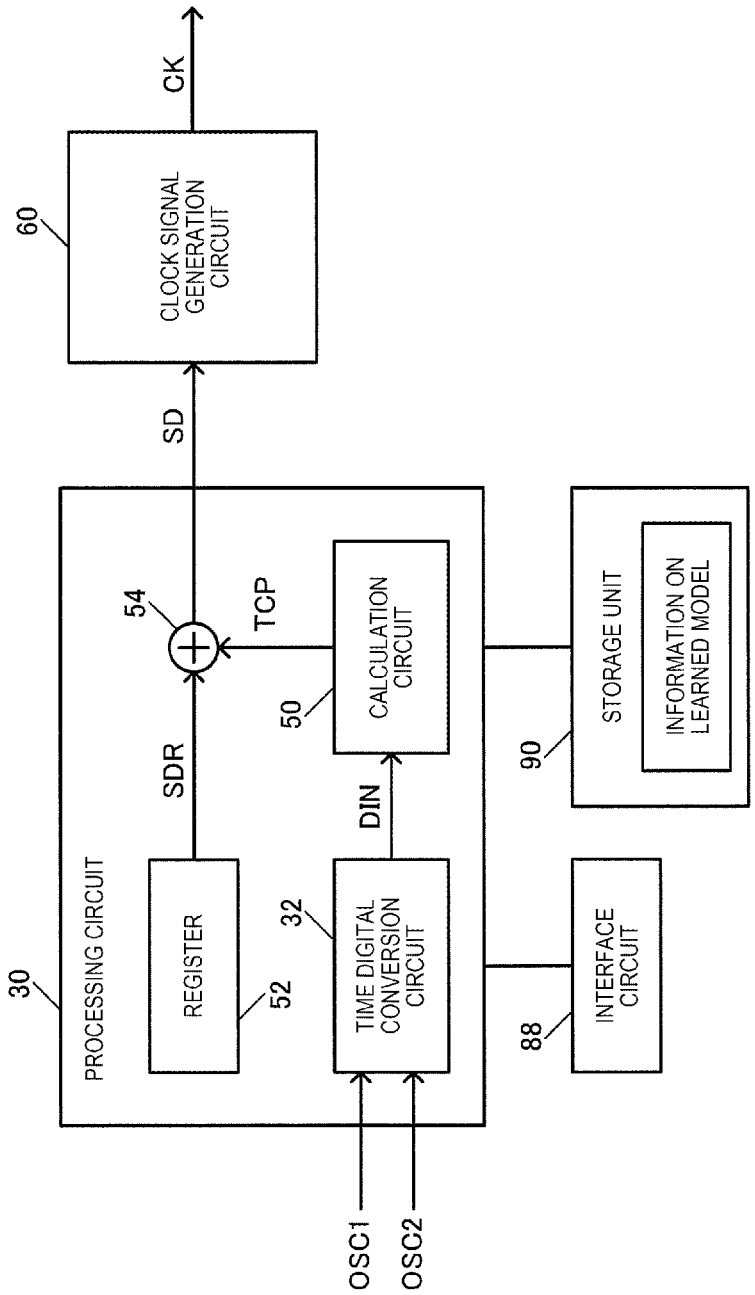
FIG. 3 shows a configuration example of a processing circuit.

FIG. 3 shows a configuration example of the processing circuit 30. The processing circuit 30 includes a time digital conversion circuit 32 and a calculation circuit 50. In addition, the processing circuit 30 can include a register 52 and an adder 54. The time digital conversion circuit 32 receives the oscillation signals OSC1 and OSC2. The time digital conversion circuit 32 performs measurement processing by a time digital conversion based on the oscillation signals OSC1 and OSC2, and outputs the measurement data. The measurement data is digital data representing a time difference between a plurality of edge timings, for example. The calculation circuit 50 receives the measurement data from the time digital conversion circuit 32 as input data DIN, and obtains temperature compensation data TCP based on the information on the learned model in the storage unit 90. The temperature compensation data TCP is data for compensating so that the frequency of the clock signal CK becomes constant with respect to a temperature change. The processing circuit 30 outputs the setting data SD corrected by the temperature compensation data TCP to the clock signal generation circuit 60. The setting data SD is data for setting the frequency of the clock signal CK, for example. For example, the register 52 stores reference setting data SDR. The register 52 can be realized by a flip-flop circuit, for example. Alternatively, the register 52 may be realized by a memory such as a RAM. The processing circuit 30 performs processing of adding the temperature compensation data TCP to the reference setting data SDR using the adder 54, and outputs the setting data SD obtained by the adding processing to the clock signal generation circuit 60. The clock signal generation circuit 60 generates a clock signal CK based on the setting data SD. For example, a clock signal CK with a frequency set by the setting data SD is generated.

The time digital conversion circuit 32 performs the time digital conversion processing based on the oscillation signals OSC1 and OSC2, for example, and performs measurement processing for a temperature detection. For example, the time digital conversion circuit 32 performs time digital conversion processing based on the oscillation signals OSC1 and OSC2, and measures the environment temperature by measuring a frequency difference between the oscillation signals OSC1 and OSC2. For example, the time digital conversion circuit 32 obtains a time difference between a plurality of edge timings of the oscillation signal OSC1, a time difference between a plurality of edge timings of the oscillation signal OSC2, or a time difference between the edge timing of the oscillation signal OSC1 and the edge timing of the oscillation signal OSC2. From these time differences, the frequency difference data between the oscillation signals OSC1 and OSC2 is obtained as measurement data for the time digital conversion processing. The frequency difference data that is measurement data is input to the calculation circuit 50 as the input data DIN. The frequency difference data can also be referred to as cycle difference data of the oscillation signals OSC1 and OSC2. The storage unit 90 stores the information on the learned model that is machine-learned so as to output data corresponding to the temperature compensation data TCP with respect to input data DIN. The calculation circuit 50 obtains the temperature compensation data TCP by performing the processing based on the information on the learned model with respect to the input data DIN obtained by the time digital conversion processing based on the oscillation signals OSC1 and OSC2. For example, the calculation circuit 50 performs neural network calculation processing as processing based on the information on the learned model. For example, the calculation circuit 50 uses the weighting coefficient information stored as the information on the learned model and performs neural network calculation processing to obtain the temperature compensation data TCP. The setting data SD corrected by the temperature compensation processing is output to the clock signal generation circuit 60 by adding the temperature compensation data TCP with respect to the reference setting data SDR as a reference for setting the frequency. The clock signal generation circuit 60 generates the clock signal CK based on the setting data SD, so that the clock signal CK with a frequency that is temperature compensated by the temperature compensation data TCP is generated.

In FIG. 3, the oscillator 4 includes an interface circuit 88 that outputs the input data DIN to the outside. For example, the interface circuit 88 is provided in the circuit device included in the oscillator 4 or the second circuit device. The interface circuit 88 is a circuit that realizes an interface such as an inter integrated circuit (I2C) and a serial peripheral interface (SPI), for example. That is, the interface circuit 88 performs interface processing with the external device of the oscillator 4. As will be described later with reference to FIG. 19, the learned model, in which information is stored in the storage unit 90, is a learning model that is machine-learned based on the input data DIN output from the interface circuit 88 and the measurement result of the frequency of the clock signal CK. Since the input data DIN can be output to the outside via the interface circuit 88 as described above, learning processing using the input data DIN can be realized. For example, it becomes possible to make machine learning to output data corresponding to the temperature compensation data TCP with respect to the input data DIN using the data obtained from the measurement result of the frequency of the clock signal CK as teacher data, and information on a learned model that is machine-learned in this way can be stored in the storage unit 90.

Figure 4:
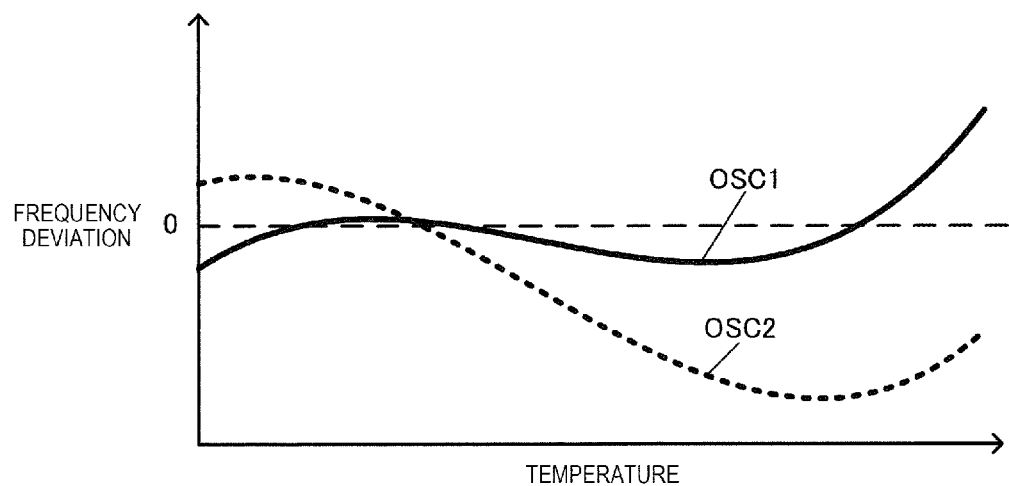
FIG. 4 shows an example of frequency-temperature characteristics of an oscillation signal.

FIG. 4 shows an example of frequency-temperature characteristics of the oscillation signals OSC1 and OSC2. The frequencies of the oscillation signals OSC1 and OSC2 fluctuate with a frequency deviation of, for example, ±several tens of ppm in a temperature range of, for example, −40° C. or more to 105° C. or less. The frequency deviation referred to here is a value obtained by dividing a difference between a nominal frequency and an actual frequency by the nominal frequency. The resonator 10 that generates the oscillation signal OSC1 and the resonator 11 that generates the oscillation signal OSC2 have different cut angles in, for example, an AT cut, or the like, and have different frequency-temperature characteristics of oscillation. By using the resonators 10 and 11 having different frequency-temperature characteristics, oscillation signals OSC1 and OSC2 having different frequency-temperature characteristics are generated as shown in FIG. 4. The time digital conversion circuit 32 performs the time digital conversion processing based on the oscillation signals OSC1 and OSC2, thereby the data corresponding to the frequency difference between the oscillation signals OSC1 and OSC2 can be input to the calculation circuit 50 as input data DIN as shown in FIG. 5.

Figure 5:
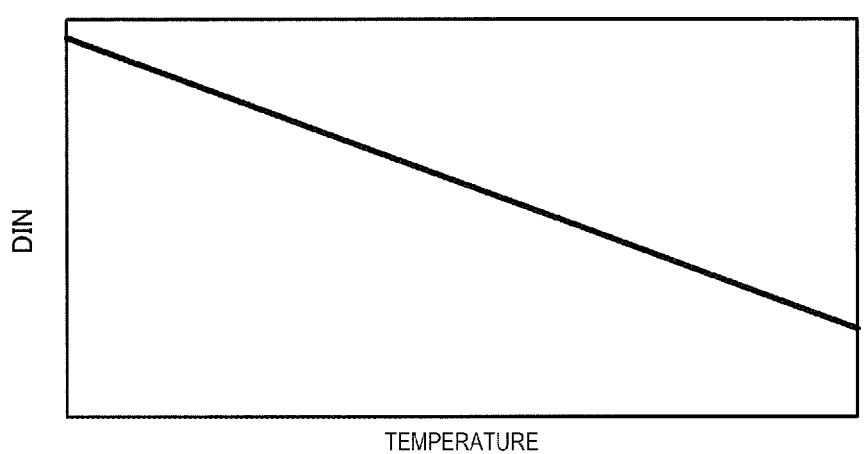
FIG. 5 shows an example of frequency-temperature characteristics of input data corresponding to a frequency difference between oscillation signals.

As shown in FIG. 5, the input data DIN has frequency characteristics that change monotonically with respect to a temperature change. For example, when the temperature rises, the value of the input data DIN decreases monotonously. For example, higher order components such as third-order components of the oscillation signals OSC1 and OSC2 are canceled by taking the frequency difference between the oscillation signals OSC1 and OSC2, and only the first-order components remain. Thereby, as shown in FIG. 5, the value of the input data DIN changes linearly (first-order) with respect to the temperature, and this input data DIN can be used as the temperature measurement data. The learned model of the present embodiment is machine-learned so as to output data corresponding to the temperature compensation data TCP with respect to the input data DIN that is the temperature measurement data. Therefore, the calculation circuit 50 can obtain the temperature compensation data TCP by performing the processing such as a neural network calculation based on the information on the learned model with respect to the input data DIN. Thereby, a clock signal CK with a frequency that is temperature compensated by the temperature compensation data TCP is generated.

As described above, in the present embodiment, the oscillation signals OSC1 and OSC2 having different frequency-temperature characteristics with each other are generated by causing the resonators 10 and 11 to oscillate. The processing circuit 30 performs the time digital conversion processing based on the oscillation signals OSC1 and OSC2, and obtains temperature compensation data TCP based on the measurement data of the time digital conversion processing. The clock signal generation circuit 60 generates a clock signal CK with a frequency that is temperature compensated by the temperature compensation data TCP. In this way, measurement data corresponding to the temperature measurement result can be obtained by performing the time digital conversion processing based on the oscillation signals OSC1 and OSC2 having different frequency-temperature characteristics with each other, temperature compensation data TCP corresponding to each temperature is obtained based on the measurement data, and temperature compensation of the clock signal CK can be realized. For example, the frequency difference data of the oscillation signals OSC1, OSC2 is obtained as measurement data by the time digital conversion processing, and the temperature compensation of the clock signal CK can be realized by obtaining the temperature compensation data based on the measurement data. The measurement by the time digital conversion processing can shorten the measurement time compared to the measurement by the count processing of the oscillation signals OSC1 and OSC2. Therefore, the temperature can be measured with high accuracy in a short time, and the temperature compensation processing can be realized with high accuracy.

That is, the above-mentioned oscillator in JP-A-4-363913 includes a counter that counts the number of pulses of two oscillation signals, and measures the temperature based on the count value obtained by the count processing of the counter. Therefore, it takes time for the count processing duration length to measure each temperature, and the temperature cannot be measured in a short time. Therefore, for example, when the temperature changes abruptly, the temperature measurement by the count processing cannot keep up with the measurement, and a situation such as a decrease in accuracy of the temperature measurement occurs.

In this regard, in this embodiment, the temperature compensation processing is performed by obtaining measurement data corresponding to the temperature measurement result by the time digital conversion processing based on the oscillation signals OSC1 and OSC2. Therefore, the temperature can be measured with high accuracy in a short time, and the temperature compensation processing can be realized with high accuracy.

In this embodiment, as shown in FIGS. 2 and 3, the storage unit 90 stores the information on the learned model that is machine-learned so as to output data corresponding to the temperature compensation data TCP with respect to input data DIN. The processing circuit 30 obtains the temperature compensation data TCP by performing the processing based on the information on the learned model using the measurement data obtained by the time digital conversion processing based on the oscillation signals OSC1 and OSC2 as the input data DIN. The clock signal generation circuit 60 generates a clock signal CK with a frequency that is temperature compensated by the temperature compensation data TCP. In this way, the temperature is measured by performing time digital conversion processing based on the oscillation signals OSC1 and OSC2 having different frequency-temperature characteristics with each other, temperature compensation data TCP corresponding to each temperature is obtained using input data DIN that is the measurement data and the information on the learned model, and then the temperature compensation of the clock signal CK can be realized. Therefore, it is possible to realize a highly accurate temperature compensation processing using the learned model.

For example, in the oscillator in JP-A-4-363913 described above, since the temperature compensation by polynomial approximation is performed based on a digital value written in advance in the ROM, the storage capacity of the ROM becomes a bottleneck, and there is a problem that a highly accurate temperature compensation is difficult. For example, when the temperature checking is made fine in order to realize a highly accurate temperature compensation, the used storage capacity of the ROM becomes excessive, and due to this, the highly accurate temperature compensation becomes difficult. Further, when checking the temperature in this way, an interpolation circuit that interpolates between the checked temperatures by a bicubic interpolation or the like is required, and when the highly accurate temperature compensation is to be realized by this interpolation circuit, the interpolation circuit becomes large-scale. The resonator has a singular point of the oscillation frequency. If accurate temperature compensation is performed at this singular point, it is necessary to make the temperature checking very fine, and this causes problems such as an increase in the storage capacity of the ROM and an increase in the size of the interpolation circuit.

In this regard, in FIGS. 2 and 3, the temperature compensation of the clock frequency is realized using the learned model that is machine-learned so as to output data corresponding to the temperature compensation data TCP with respect to the input data DIN that is the measurement data of the time digital conversion processing. For example, since the information on the learned model such as weighting coefficients in the neural network calculation is obtained by machine learning, the storage capacity of the storage unit 90 that stores the information on the learned model does not have to be so large. For example, in the oscillator in JP-A-4-363913, there is a problem that the storage capacity of the ROM becomes excessive when trying to realize highly accurate temperature compensation, but in the method of this embodiment using learned model, even if the storage capacity of the storage unit 90 is not so large, highly accurate temperature compensation can be realized. Further, since the temperature measurement is performed using the plurality of resonators 10 and 11, highly accurate temperature measurement can be realized. Therefore, the temperature compensation with higher accuracy can be realized as compared with the oscillator of JP-A-4-363913.

For example, by performing the temperature compensation processing using the information on the learned model, it is possible to realize a more accurate and appropriate temperature compensation processing. For example, at the time of manufacture or shipment of the oscillator 4, the information on the learned model obtained by measuring the frequency-temperature characteristics of the oscillator 4 is written and stored in the storage unit 90 which is realized by a non-volatile memory or the like. For example, at the time of manufacture or shipment of the oscillator 4, the frequency characteristics of the clock signal at each temperature are measured while changing the environmental temperature using a constant temperature oven or the like. Thereafter, the information on the learned model obtained based on the measurement result is written and stored in the storage unit 90. For example, the clock frequency and the temperature measurement result (DIN) at each temperature are monitored, and the information on the learned model that is machine-learned so as to obtain appropriate temperature compensation data TCP at each temperature is written and stored in the storage unit 90. As described above, during the actual operation of the oscillator 4, the processing circuit 30 can execute the temperature compensation processing for obtaining the temperature compensation data TCP corresponding to the input data DIN from the time digital conversion circuit 32. As a result, it is possible to realize the temperature compensation processing in which an affection such as manufacturing process variation or circuit characteristics variation is suppressed and canceled.

For example, in the present embodiment, the processing circuit 30 performs neural network calculation processing as processing based on the information on the learned model. Specifically, the calculation circuit 50 performs neural network calculation processing. A neural network is a mathematical model for simulating brain functions on a computer, and has an input layer, an intermediate layer, and an output layer. The input layer is a neuron that outputs an input value. In each neuron after the intermediate layer, a calculation is performed that simulates how information is transmitted as an electrical signal in a brain. In the brain, since the ease of transmission of information changes according to the synaptic bonding strength, the neural network expresses the bonding strength with a weight. Further, in the calculation in a neuron, an activation function that is a non-linear function is used. For example, a ReLU function, a sigmoid function, or the like is used as the activation function. In each neuron, a calculation is performed for multiplying and summing the outputs of each neuron in the previous layer coupled to the neuron using the weight, a bias is added, and a calculation that applies the activation function is performed. The calculation result in the output layer becomes the output of the neural network.

In a neural network, in order to obtain a desired output from an input, it is necessary to set appropriate weights and biases. Note that the weight is also represented as a weighting coefficient. The weighting coefficient may include a bias. In learning, a data set in which an input is associated with a correct output at the input is prepared. The correct output is teacher data. Neural network learning processing can be considered as processing for obtaining the most probable weighting coefficient based on the data set. As the neural network learning processing, for example, an error inverse propagation method can be used. In the error inverse propagation method, parameters are updated by repeating the forward path and the backward path. The parameter here is a weighting coefficient.

In this embodiment, the input of the neural network is input data DIN that is input from the time digital conversion circuit 32 to the calculation circuit 50, and the input data DIN can be used as the temperature measurement data as shown in FIG. 5. The storage unit 90 stores, for example, information on the weighting coefficient of the neural network as the information on the learned model. Alternatively, the storage unit 90 may store the information relating to the configuration of a neural network, and the information relating to the sequence control of a neural network calculation, as the information on the learned model. An input layer, an intermediate layer, and an output layer are included in the learned model, and the weighting coefficient information is set based on a data set in which the input data DIN and the temperature compensation data TCP are associated with each other. The calculation circuit 50 performs a calculation based on the weighting coefficient information stored in the storage unit 90 using the input data DIN as an input of the input layer of the learned model, and performs a neural network calculation so that the temperature compensation data TCP is output as the output of the output layer of the learned model. In this case, for example, in the learning stage at the time of manufacture and shipment, the clock frequency at each temperature is measured, and a temperature compensation data TCP for making the clock frequency constant with respect to the temperature change is obtained based on the measured clock frequency. Based on the data set in which the temperature compensation data TCP and the input data DIN corresponding to the temperature measurement data at each temperature are associated with each other, the weighting coefficient information is set, and written in the storage unit 90 as the information on the learned model. As described above, it becomes possible to realize temperature compensation processing with the clock frequency by processing based on the information on the learned model.

Note that the machine learning in the present embodiment is not limited to a technique using a neural network. Various well-known machine learning methods such as a support vector machine (SVM), or machine learning methods developed from these methods can be applied, for example. The information on the learned model may be updated after the oscillator 4 is shipped. The temperature compensation processing based on the information on the learned model only needs to operate in a state where the oscillator 4 is mounted. The configuration for performing the temperature compensation processing is not necessarily limited to that accommodated in the same package as other circuit elements, and may be provided outside the package of the oscillator 4.

2. Processing Circuit, Time Digital Conversion Circuit

Figure 6:
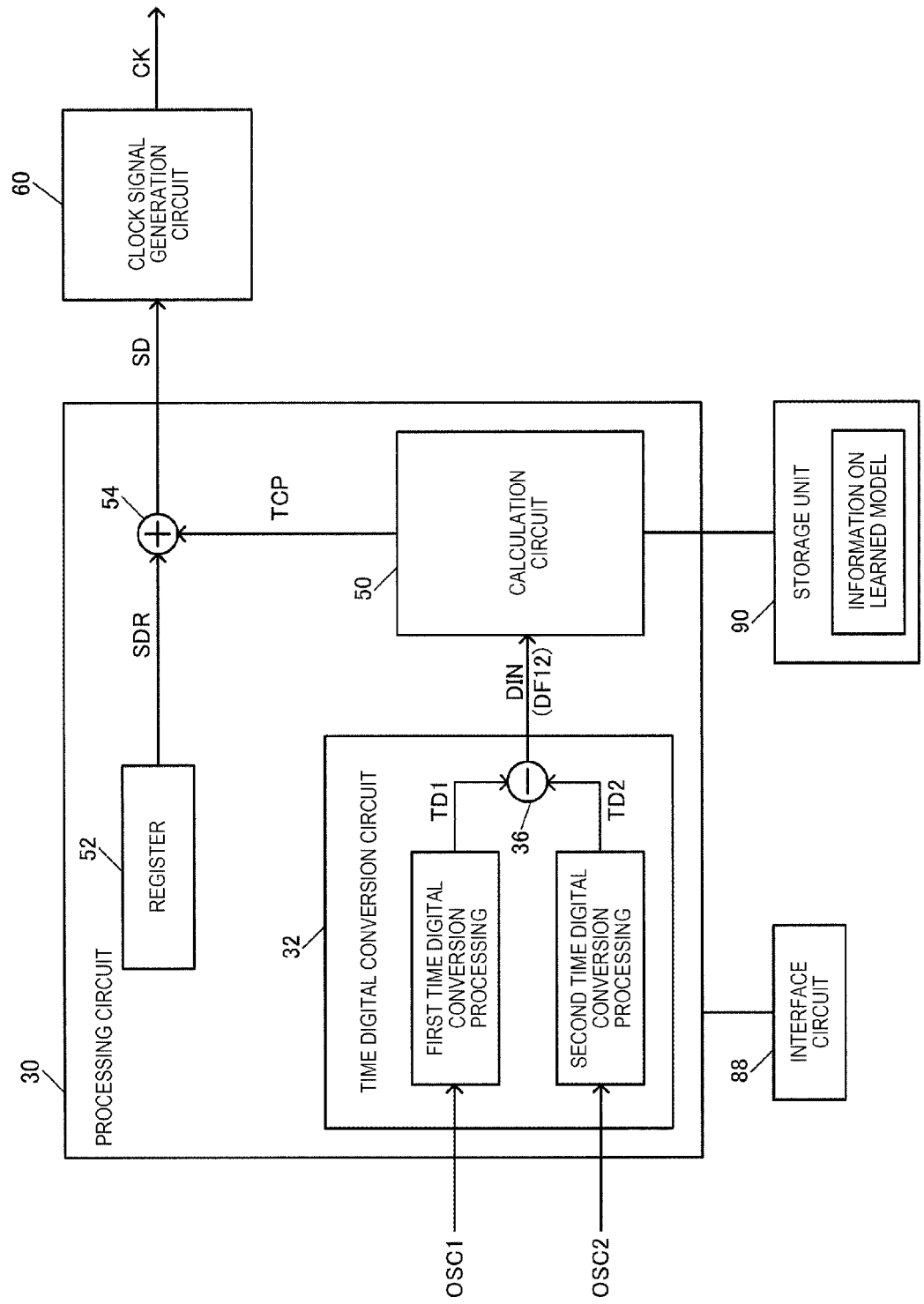
FIG. 6 shows a first configuration example of a processing circuit and a time digital conversion circuit.
Figure 7:
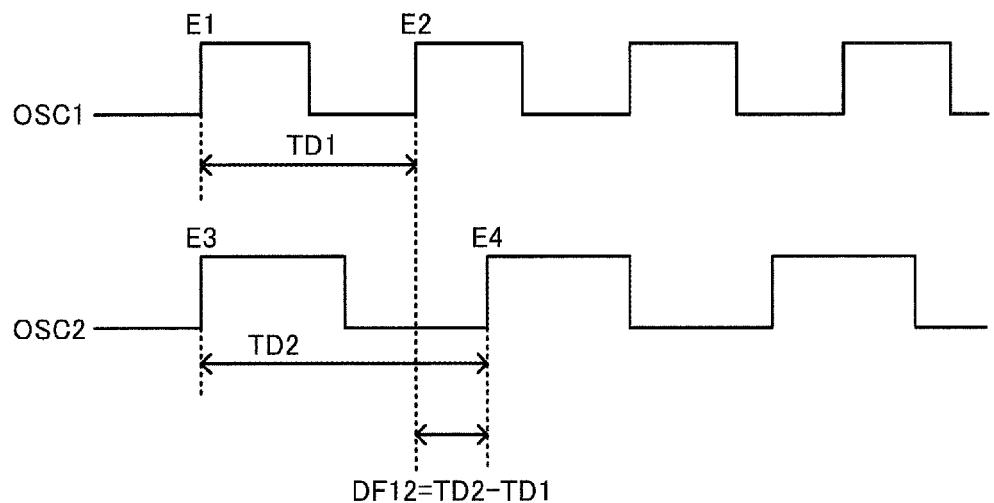
FIG. 7 is a signal waveform example for explaining an operation of the first configuration example.

Next, detailed configuration examples of the processing circuit 30 and the time digital conversion circuit 32 will be described. FIG. 6 shows a first configuration example of the processing circuit 30 and the time digital conversion circuit 32, and FIG. 7 shows a signal waveform example for explaining the operation of the first configuration example.

The processing circuit 30 performs the first time digital conversion processing based on the oscillation signal OSC1 and the second time digital conversion processing based on the oscillation signal OSC2. Specifically, the processing circuit 30 performs the first time digital conversion processing for measuring a time difference TD1 between an edge timing E1 and the edge timing E2 of the oscillation signal OSC1 in FIG. 7. The edge timing E2 is an edge timing after the edge timing E1, for example, an edge timing following E1. Further, the processing circuit 30 performs the second time digital conversion processing for measuring a time difference TD2 between an edge timing E3 and the edge timing E4 of the oscillation signal OSC2. The edge timing E4 is an edge timing after the edge timing E3, for example, an edge timing following E3. The edge timings E1, E2, E3, and E4 are the first edge timing, the second edge timing, the third edge timing, and the fourth edge timing, respectively. The time differences TD1 and TD2 are the first time difference and the second time difference, respectively.

The processing circuit 30 obtains data corresponding to the difference between the time difference TD1 and the time difference TD2 as the frequency difference data DF12 of the oscillation signals OSC1 and OSC2, and obtains the temperature compensation data TCP using the frequency difference data DF12 as measurement data. The frequency difference data DF12 can also be referred to as cycle difference data of the oscillation signals OSC1 and OSC2. For example, the time digital conversion circuit 32 of the processing circuit 30 is provided with a subtractor 36. The subtractor 36 may be realized by an adder. The subtractor 36 performs subtraction processing between the time difference TD1 obtained by the first time digital conversion processing and the time difference TD2 obtained by the second time digital conversion processing, and the frequency difference data DF12 corresponding to the difference between the time differences TD1 and TD2 is output. The frequency difference data DF12 that is the measurement data is input to the calculation circuit 50 as the input data DIN, and the temperature compensation data TCP is obtained by the calculation circuit 50.

According to the configuration in FIG. 6, the time difference TD1 is obtained by the first time digital conversion processing based on the oscillation signal OSC1, the time difference TD2 is obtained by the second time digital conversion processing based on the oscillation signal OSC2, and the frequency difference data DF12 of the oscillation signals OSC1, OSC2 can be obtained from the time differences TD1 and TD2. Then, the temperature compensation data TCP is obtained using the frequency difference data DF12 as the temperature measurement data, and the temperature compensation processing of the clock frequency can be realized. That is, the processing circuit 30 can obtain the temperature compensation data TCP using the data corresponding to the difference between the time difference TD1 and the time difference TD2 as the measurement data.

In FIG. 7, the frequency difference data DF12 is expressed as DF12=TD2−TD1, but the frequency difference data may be expressed as DF12=TD1−TD2. Further, FIG. 7 shows a case where the edge indicated by E1 of the oscillation signal OSC1 and the edge indicated by E3 of the oscillation signal OSC2 are aligned for the sake of simplicity of explanation, but this embodiment is not limited to this.

Figure 8:
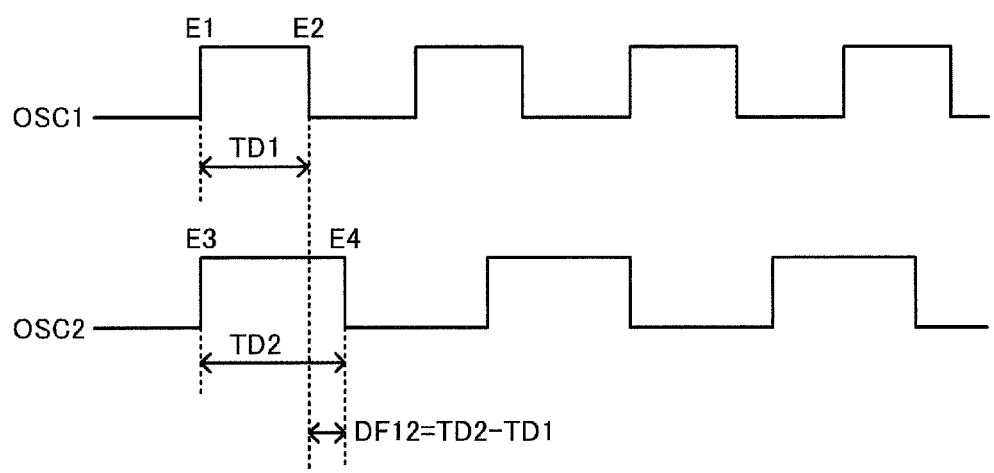
FIG. 8 is a signal waveform example for explaining an operation of the first configuration example.

In FIG. 7, the edges E1, E2, E3, and E4 are rising edges, but the edges E1, E2, E3, and E4 may be falling edges. Alternatively, as shown in FIG. 8, the edge E1 of the oscillation signal OSC1 may be a rising edge, and the edge E2 may be a falling edge. Further, the edge E3 of the oscillation signal OSC2 may be a rising edge, and the edge E4 may be a falling edge.

That is, in FIG. 7, the time differences TD1 and TD2 are the time differences of a length corresponding to one cycle of the oscillation signals OSC1 and OSC2, but this embodiment is not limited to this. For example, as shown in FIG. 8, the time differences TD1 and TD2 may be a time difference of a length corresponding to a half cycle of the oscillation signals OSC1 and OSC2. Alternatively, the time differences TD1 and TD2 may be a time difference of a length of corresponding to a plurality of cycles of the oscillation signals OSC1 and OSC2. For example, the cycle of the oscillation signal OSC1 is set to TP1, the cycle of the oscillation signal OSC2 is set to TP2, and J is set to an integer of one or more. In this case, the edge timing E2 can be said to be an edge timing delayed by $0.5 \times J \times TP1$ from the edge timing E1. Further, the edge timing E4 can be said to be an edge timing delayed by $0.5 \times J \times TP2$ from the edge timing E3. That is, the frequency difference data (DF12=TD2−TD1) corresponding to the difference between the time differences TD1 and TD2 becomes data corresponding to the cycle difference (TP2−TP1) between the oscillation signals OSC1 and OSC2.

In FIG. 6, the processing circuit 30 obtains the frequency difference data DF12 by the first time digital conversion processing and the second time digital conversion processing, which are time digital conversion processing, and performs processing based on the information on the learned model using the frequency difference data DF12 as the input data DIN. Specifically, the time digital conversion circuit 32 measures the time difference TD1 by the first time digital conversion processing based on the oscillation signal OSC1, and measures the time difference TD2 by the second time digital conversion processing based on the oscillation signal OSC2. The time digital conversion circuit 32 obtains the frequency difference data DF12 from the time differences TD1 and TD2, and the calculation circuit 50 performs processing based on the information on the learned model using the frequency difference data DF12 as the input data DIN to obtain the temperature compensation data TCP. Then, the temperature compensation data TCP is added to the reference setting data SDR, the setting data SD that is the addition result is input to the clock signal generation circuit 60, and the clock signal generation circuit 60 generates a temperature compensated clock signal CK. Thus, by obtaining the frequency difference data DF12 of the oscillation signals OSC1 and OSC2, input data DIN which becomes the temperature measurement data can be obtained, as shown in FIG. 5. The temperature compensation data TCP can be obtained by performing the processing such as a neural network calculation based on the information on the learned model with respect to the input data DIN.

Figure 9:
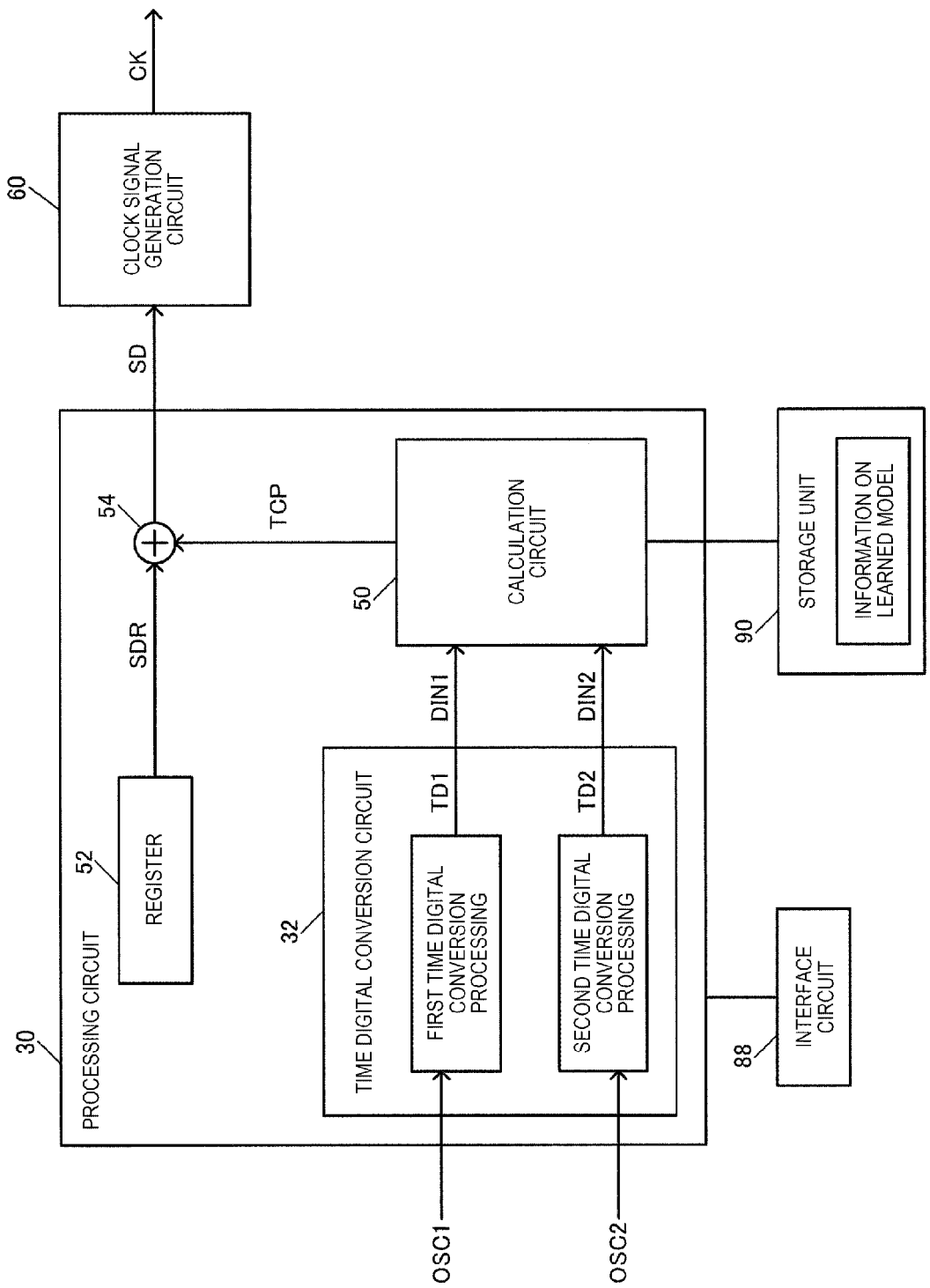
FIG. 9 shows a second configuration example of the processing circuit and the time digital conversion circuit.

FIG. 9 shows a second configuration example of the processing circuit 30 and the time digital conversion circuit 32. In FIG. 9, the processing circuit 30 performs the first time digital conversion processing for measuring the time difference TD1 between the edge timings E1 and E2 of the oscillation signal OSC1, and the second time digital conversion processing for measuring the time difference TD2 between the edge timings E3 and E4 of the oscillation signal OSC2. The processing circuit 30 obtains the temperature compensation data TCP using the data of the time difference TD1 and the data of the time difference TD2 as the measurement data. That is, in FIG. 6, the frequency difference data DF12 obtained from the time differences TD1 and TD2 is input to the calculation circuit 50 as the input data DIN, but in FIG. 9, data of time differences TD1 and TD2 are input to the calculation circuit 50 as the input data DIN1 and DI2. The calculation circuit 50 performs processing based on the information on the learned model by using the data of the time differences TD1 and TD2 as input data DIN1 and DIN2, and obtains the temperature compensation data TCP. That is, in FIG. 9, the information on the learned model that is machine-learned so as to output data corresponding to the temperature compensation data TCP with respect to the input data DIN1 and DIN2 that are data of the time differences TD1 and TD2 is stored in the storage unit 90. The calculation circuit 50 obtains the temperature compensation data TCP based on the information on the learned model that is machine-learned in above-described way.

According to the configuration in FIG. 9, the time difference TD1 is obtained by the first time digital conversion processing based on the oscillation signal OSC1, the time difference TD2 is obtained by the second time digital conversion processing based on the oscillation signal OSC2, the temperature compensation data TCP is obtained using the data of these time differences TD1 and TD2 as temperature measurement data, and the temperature compensation processing of the clock frequency can be realized.

Further, the processing circuit 30 according to the present embodiment may have a configuration in which FIGS. 6 and 9 are combined. For example, the information on the learned model, which is machine-learned so as to output data corresponding to the temperature compensation data TCP with respect to the input data DIN that is the frequency difference data DF12 and with respect to the input data DIN1 and DIN2 that are the data of the time differences TD1 and TD2, is stored in the storage unit 90. The calculation circuit 50 may obtain the temperature compensation data TCP by performing the processing based on the information on the learned model with respect to the input data DIN, DIN1, and DIN2. By increasing the number of input data in this way, it becomes possible to realize further high accurate temperature compensation processing. Alternatively, for input data DIN, DIN1, and DIN2, processing such as taking the powers of 2 or 3 of these input data values, is performed, and the processed data may be used as input data for the learned model. Thereby, it is possible to expect the further high accurate temperature compensation processing.

Next, details of the time digital conversion processing will be described. For example, the first time digital conversion processing described with reference to FIGS. 6 to 9 is performed by the time digital converter 33 and the second time digital conversion processing is performed by the time digital converter 34 in FIG. 2. As described above, the time digital converters 33 and 34 perform the first time digital conversion processing and the second time digital conversion processing respectively, so that the first time digital conversion processing and the second time digital conversion processing can be executed in parallel, and as a result, high-speed time digital conversion processing can be realized.

Note that the processing circuit 30 may execute the first time digital conversion processing and the second time digital conversion processing in a time division manner. For example, the processing circuit 30 may perform the first time digital conversion processing for measuring the time difference TD1 in FIG. 7, and after the first time digital conversion processing is completed, the processing circuit 30 may execute the second time digital conversion processing for measuring the time difference TD2. In this way, it is necessary to provide only one time digital converter for the processing circuit 30 for example, and the circuit scale of the processing circuit 30 can be reduced.

The first time digital conversion processing and the second time digital conversion processing can be realized by the operation and configuration described with reference to FIGS. 10 and 11, for example. Note that in the present embodiment, the first time digital conversion processing that is performed by the time digital converter 33 is mainly described as an example, and since the second time digital conversion processing performed by the time digital converter 34 can also be realized by the same operation and configuration, description thereof will be omitted as appropriate.

Figure 10:
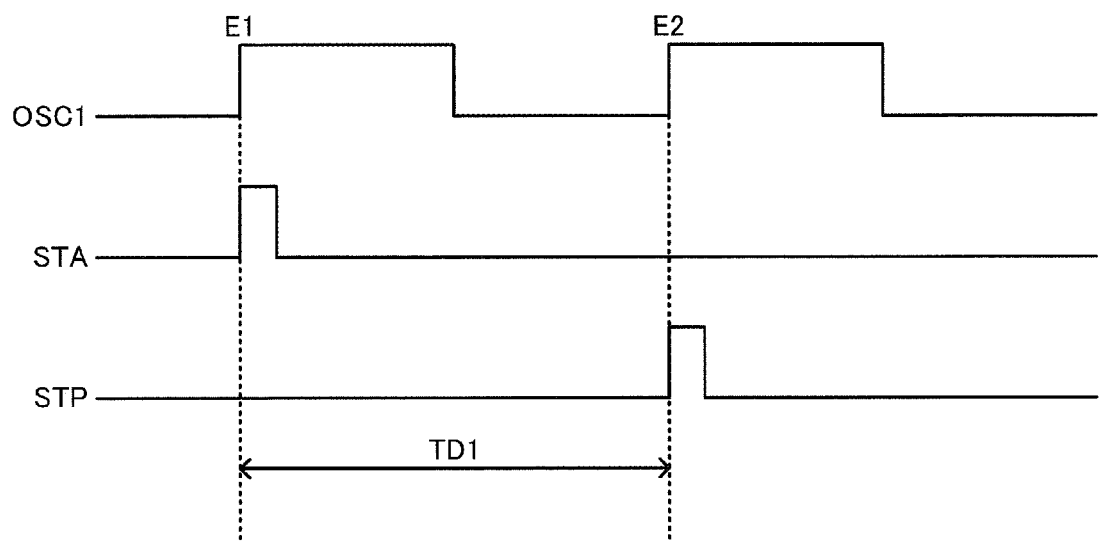
FIG. 10 is a signal waveform example for explaining time digital conversion processing.

In FIG. 10, at an edge timing E1 of the oscillation signal OSC1, a signal STA that is a start signal becomes active, and a start pulse is generated. Further, at an edge timing E2 of the oscillation signal OSC1, a signal STP that is a stop signal becomes active, and a stop pulse is generated. The time digital converter 33 performs the first time digital conversion processing based on the signals STA and STP, measures the time difference TD1 from a rising edge of the signal STA to a rising edge of the signal STP, and outputs the data of the time difference TD1 as digital measurement data. Further, the time digital converter 34 performs the second time digital conversion processing based on the signals STA and STP, measures the time difference TD2 from a rising edge of the signal STA to a rising edge of the signal STP, and outputs the data of the time difference TD2 as digital measurement data. Note that the first time digital conversion processing and the second time digital conversion processing may be executed by the time digital converter 33 in a time division manner, for example.

Figure 11:
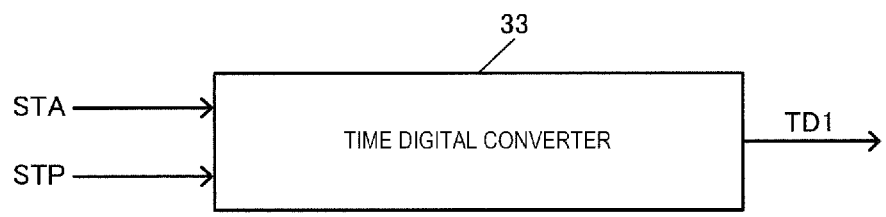
FIG. 11 is an explanatory diagram of a time digital converter.

For example, as shown in FIG. 11, the time digital converter 33 performs time digital conversion processing for converting a time difference between edge timings, which are transition timings of the signal STA and the signal STP, into digital data, and outputs data of the time difference TD1. The same applies to the time digital converter 34. As the circuit configuration of these time digital converters 33 and 34, various known configurations can be adopted. As an example, the time digital converters 33 and 34 can be realized by a circuit or the like that generates digital data corresponding to the decimal part of the division result by coding a plurality of delay elements, a plurality of latch circuits that latch a plurality of delay clock signals output from the plurality of delay elements at the edge timing of the reference signal, and output signals of the plurality of latch circuits. Alternatively, time digital conversion method using a frequency difference between two oscillation signals as a measurement time resolution may be performed. For example, time digital conversion may be realized by providing a synchronization circuit such as a PLL circuit that syncs the edge timing of two oscillation signals for each phase synchronization timing, or by providing a phase comparison circuit that compares the phases of two oscillation signals.

Figure 12:
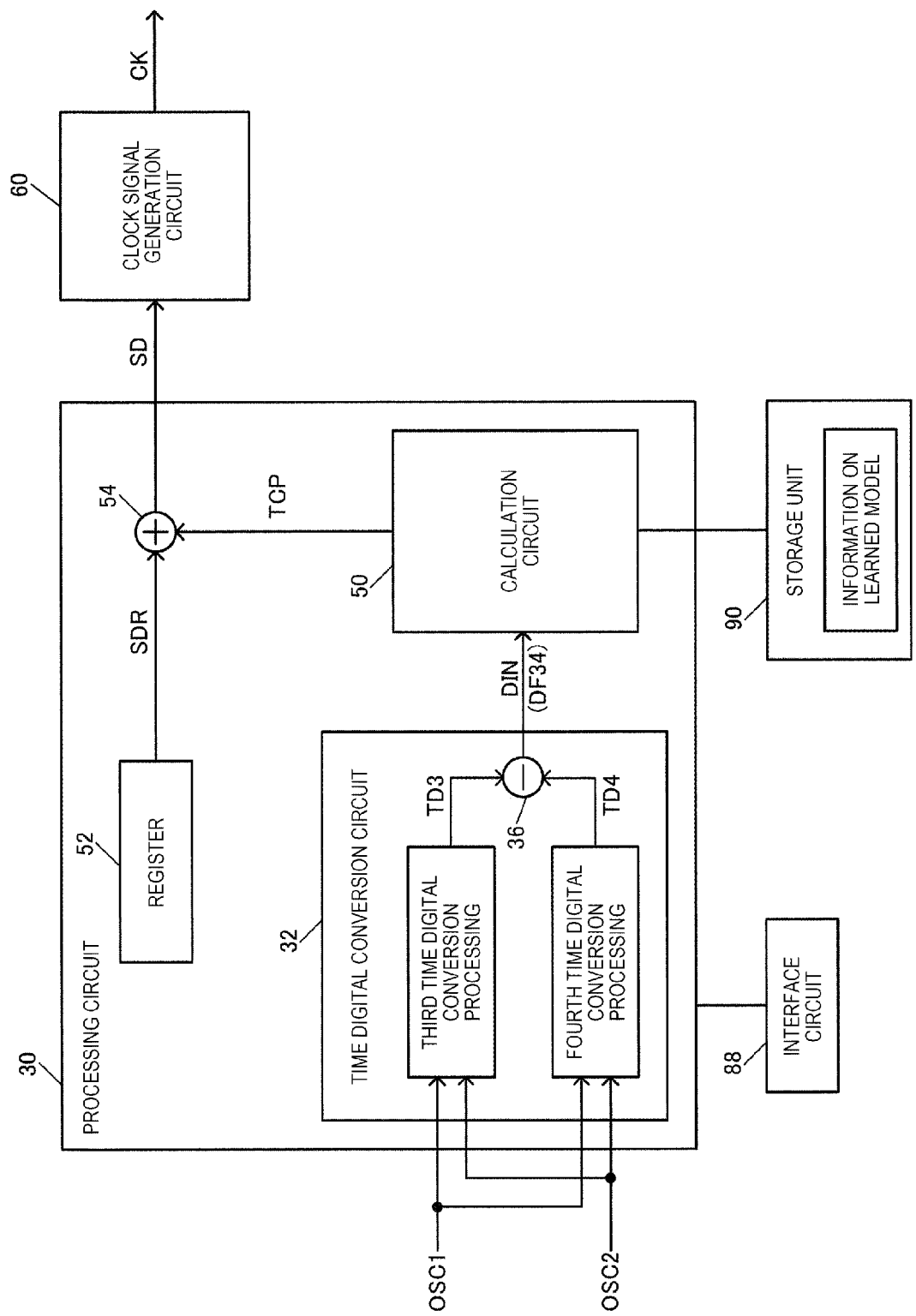
FIG. 12 shows a third configuration example of the processing circuit and the time digital conversion circuit.
Figure 13:
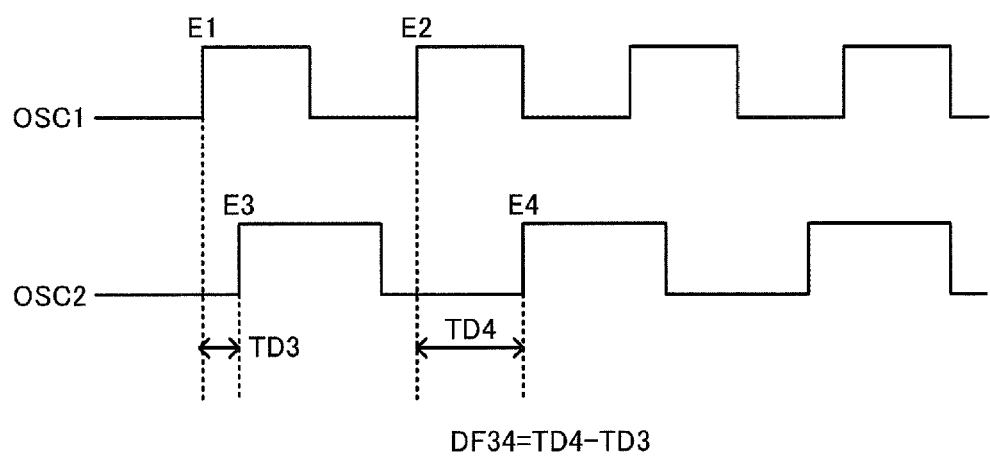
FIG. 13 is a signal waveform example for explaining an operation of the third configuration example.

FIG. 12 shows a third configuration example of the processing circuit 30 and the time digital conversion circuit 32, and FIG. 13 shows a signal waveform example for explaining the operation of the third configuration example. In FIG. 12, the processing circuit 30 performs third time digital conversion processing for measuring a time difference TD3 between the edge timing E1 of the oscillation signal OSC1 and the edge timing E3 of the oscillation signal OSC2 in FIG. 13, and performs fourth time digital conversion processing for measuring a time difference TD4 between the edge timing E2 of the oscillation signal OSC1 and the edge timing E4 of the oscillation signal OSC2. The time difference TD3 is a third time difference, and the time difference TD4 is a fourth time difference. The processing circuit 30 obtains data corresponding to the difference between the time difference TD3 and the time difference TD4 as the frequency difference data DF34 of the oscillation signals OSC1 and OSC2, and obtains the temperature compensation data TCP using the frequency difference data DF34 as measurement data. Specifically, the subtractor 36 performs subtraction processing between the time difference TD3 obtained by the third time digital conversion processing and the time difference TD4 obtained by the fourth time digital conversion processing, and the frequency difference data DF34 corresponding to the difference between the time differences TD3 and TD4 is output. The frequency difference data DF34 that is the measurement data is input to the calculation circuit 50 as the input data DIN, and the temperature compensation data TCP is obtained by the calculation circuit 50. For example, the processing circuit 30 obtains the frequency difference data DF34 by the third time digital conversion processing and the fourth time digital conversion processing, which are time digital conversion processing, and performs processing based on the information on the learned model using the frequency difference data DF34 as the input data DIN. Specifically, the calculation circuit 50 performs processing based on the information on the learned model by using the frequency difference data DF34 as the input data DIN, and obtains the temperature compensation data TCP. Then, the temperature compensation data TCP is added to the reference setting data SDR, the setting data SD that is the addition result is input to the clock signal generation circuit 60, and the clock signal generation circuit 60 generates a temperature compensated clock signal CK.

According to the configuration in FIG. 12, the time difference TD3 is obtained by the third time digital conversion processing based on the oscillation signals OSC1 and OSC2, the time difference TD4 is obtained by the fourth time digital conversion processing based on the oscillation signals OSC1 and OSC2, and the frequency difference data DF34 of the oscillation signals OSC1, OSC2 can be obtained from the time differences TD3 and TD4. Then, the temperature compensation data TCP is obtained using the frequency difference data DF34 as the temperature measurement data, and the temperature compensation processing of the clock frequency can be realized. That is, the processing circuit 30 can obtain the temperature compensation data TCP using the data corresponding to the difference between the time difference TD3 and the time difference TD4 as the measurement data.

In FIG. 13, the frequency difference data DF34 is expressed as DF34=TD4−TD3, but the frequency difference data may be expressed as DF34=TD3−TD4. In FIG. 13, the edges E1, E2, E3, and E4 are rising edges, but the edges E1, E2, E3, and E4 may be falling edges. When the cycles of the oscillation signals OSC1 and OSC2 are set to TP1 and TP2, in FIG. 13, the edge timing E2 is a timing that is delayed by the cycle TP1 from the edge timing E1, and the edge timing E4 is a timing delayed by the cycle TP2 from the edge timing E3, but the present embodiment is not limited to this. For example, when K is an integer of one or more, the edge timing E2 may be a timing delayed by 0.5×K×TP1 from the edge timing E1. The edge timing E4 may be a timing delayed by 0.5×K×TP2 from the edge timing E3. The edge timing E3 of the oscillation signal OSC2 is an edge timing corresponding to the edge timing E1 of the oscillation signal OSC1, and is, for example, the edge timing closest to the edge timing E1 after the edge timing E1, for example. The edge timing E4 of the oscillation signal OSC2 is an edge timing corresponding to the edge timing E2 of the oscillation signal OSC1, and is, for example, the edge timing closest to the edge timing E2 after the edge timing E2, for example.

Figure 14:
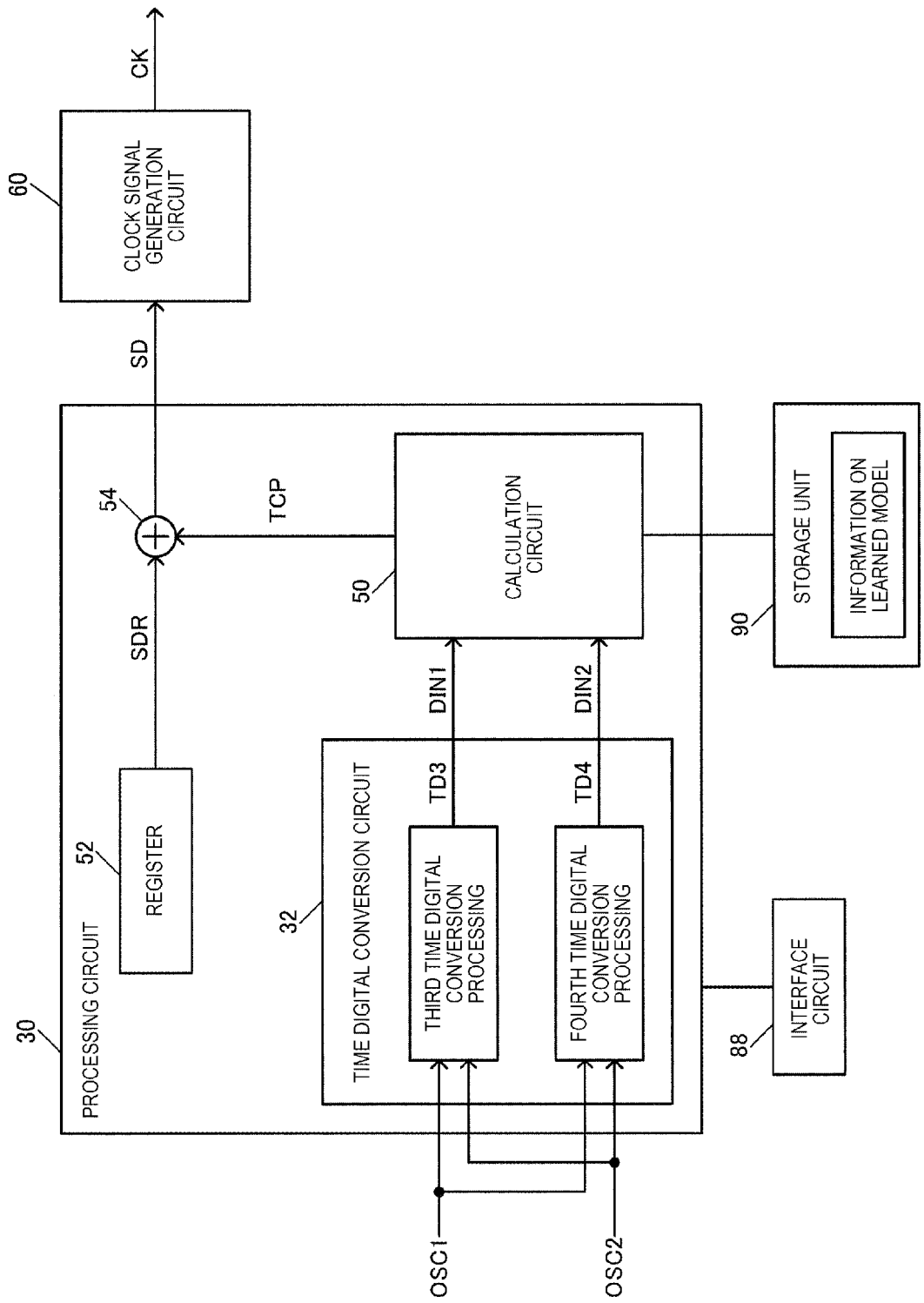
FIG. 14 shows a fourth configuration example of the processing circuit and the time digital conversion circuit.

FIG. 14 shows a fourth configuration example of the processing circuit 30 and the time digital conversion circuit 32. In FIG. 14, the third time digital conversion processing for measuring a time difference TD3 between the edge timing E1 of the oscillation signal OSC1 and the edge timing E3 of the oscillation signal OSC2 is performed, and the fourth time digital conversion processing for measuring a time difference TD4 between the edge timing E2 of the oscillation signal OSC1 and the edge timing E4 of the oscillation signal OSC2 is performed. The processing circuit 30 obtains the temperature compensation data TCP using the data of the time difference TD3 and the data of the time difference TD4 as the measurement data. Specifically, the calculation circuit 50 performs processing based on the information on the learned model by using the data of the time differences TD3 and TD4 as input data DIN1 and DIN2, and obtains the temperature compensation data TCP. That is, in FIG. 14, the information on the learned model that is machine-learned so as to output data corresponding to the temperature compensation data TCP with respect to the input data DIN1 and DIN2 that are data of the time differences TD3 and TD4 is stored in the storage unit 90. The calculation circuit 50 obtains the temperature compensation data TCP based on the information on the learned model that is machine-learned in above-described way.

According to the configuration in FIG. 14, the time difference TD3 is obtained by the third time digital conversion processing based on the oscillation signals OSC1 and OSC2, the time difference TD4 is obtained by the fourth time digital conversion processing based on the oscillation signals OSC1 and OSC2, the temperature compensation data TCP is obtained using the data of these time differences TD3 and TD4 as temperature measurement data, and the temperature compensation processing of the clock frequency can be realized.

Further, the processing circuit 30 according to the present embodiment may have a configuration in which FIGS. 12 and 14 are combined. For example, the information on the learned model, which is machine-learned so as to output data corresponding to the temperature compensation data TCP with respect to the input data DIN that is the frequency difference data DF34 and with respect to the input data DIN1 and DIN2 that are the data of the time differences TD3 and TD4, is stored in the storage unit 90. The calculation circuit 50 may obtain the temperature compensation data TCP by performing the processing based on the information on the learned model with respect to the input data DIN, DIN1, and DIN2. By increasing the number of input data in this way, it becomes possible to realize further high accurate temperature compensation processing.

Figure 15:
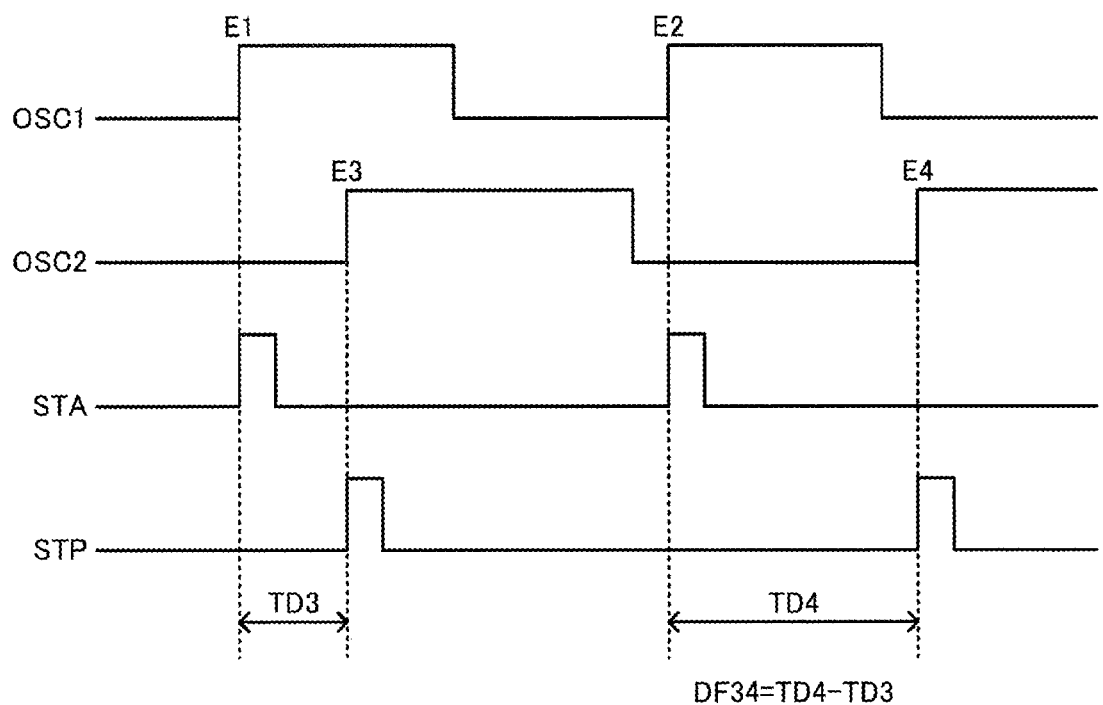
FIG. 15 is a signal waveform example for explaining a time digital conversion.

In the case of the third and fourth configuration examples in FIGS. 12 and 14, for example, the time digital conversion processing can be realized by using one time digital converter 33. For example, in FIG. 15, at an edge timing E1 of the oscillation signal OSC1, a signal STA that is a start signal becomes active, and a start pulse is generated. Further, at an edge timing E3 of the oscillation signal OSC2, a signal STP that is a stop signal becomes active, and a stop pulse is generated. Then, the time digital converter 33 performs the third time digital conversion processing for measuring the time difference TD3 based on the signals STA and STP, and outputs the data of the time difference TD3 as the digital measurement data. Next, at an edge timing E2 of the oscillation signal OSC1, a signal STA that is a start signal becomes active, and a start pulse is generated. Further, at an edge timing E4 of the oscillation signal OSC2, a signal STP that is a stop signal becomes active, and a stop pulse is generated. Then, the time digital converter 33 performs the fourth time digital conversion processing for measuring the time difference TD4 based on the signals STA and STP, and outputs the data of the time difference TD4 as the digital measurement data. In this way, the third time digital conversion processing and the fourth time digital conversion processing can be realized by using one time digital converter 33.

3. Clock Signal Generation Circuit

Figure 16:
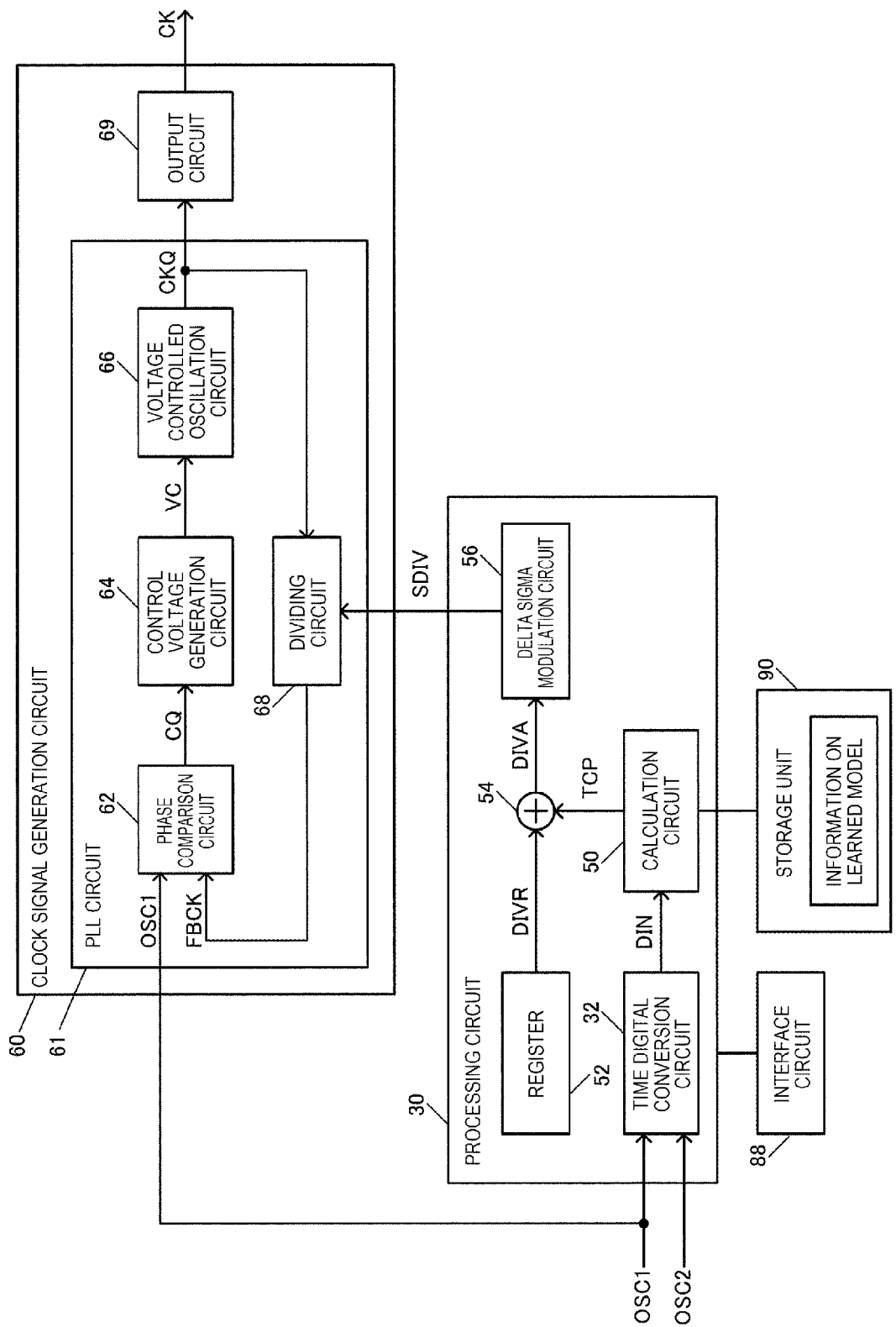
FIG. 16 shows a first configuration example of a clock signal generation circuit.

Next, a configuration example of the clock signal generation circuit 60 will be described. FIG. 16 shows a first configuration example of the clock signal generation circuit 60. In FIG. 16, the clock signal generation circuit 60 includes a fractional N-type PLL circuit 61. For example, the PLL circuit 61 receives the oscillation signal OSC1 as an input clock signal. The input clock signal is a reference clock signal of the PLL circuit 61. Note that the oscillation signal OSC2 may be input to the PLL circuit 61 as an input clock signal. The processing circuit 30 outputs the division ratio setting data SDIV corrected by the temperature compensation data TCP with respect to the dividing circuit 68 included in the PLL circuit 61. In this case, the setting data SD in FIG. 3 becomes the division ratio setting data SDIV.

As described above, in FIG. 16, the clock signal generation circuit 60 includes the fractional N-type PLL circuit 61 to which the oscillation signal OSC1 is input as the input clock signal, and the division ratio setting data SDIV is input to the dividing circuit 68 of the PLL circuit 61. In this way, the division ratio setting data SDIV corrected by the temperature compensation data TCP is input to the dividing circuit 68 of the PLL circuit 61, and a PLL operation for multiplying the frequency of the oscillation signal OSC1 is realized, and the clock signal CK based on the signal obtained by multiplying the frequency of the oscillation signal OSC1 can be generated. Thereby, the clock signal CK, on which the temperature compensation processing is performed, can be generated based on the oscillation signal OSC1. Further, by using the fractional N-type PLL circuit 61, not only an integer but also a fraction can be set as a division ratio of the PLL circuit 61, and a clock signal CK having any frequency can be generated.

Next, the configurations of the clock signal generation circuit 60 and the processing circuit 30 in FIG. 16 will be described in more detail. In FIG. 16, the clock signal generation circuit 60 includes a PLL circuit 61 and an output circuit 69.

The output circuit 69 outputs the clock signal CK based on the output clock signal CKQ of the PLL circuit 61. For example, the output circuit 69 includes a dividing circuit (not shown), and can variably set the frequency of the clock signal CK by dividing the frequency of the output clock signal CKQ by the dividing circuit. Thereby, the frequency of the clock signal CK can be set to a frequency desired by a user. Further, the output circuit 69 outputs the clock signal CK to the outside in a signal format such as a low voltage differential signaling (LVDS), a positive emitter coupled logic (PECL), an high speed current steering logic (HCSL), or a differential complementary MOS (CMOS). For example, the output circuit 69 may be a circuit that can output the clock signal CK in at least two signal formats of LVDS, PECL, HCSL, and differential CMOS. In this case, the output circuit 69 outputs the clock signal CK in the signal format set by the processing circuit 30.

The PLL circuit 61 receives the oscillation signal OSC1 as an input clock signal and performs a phase locked loop (PLL) operation. For example, the PLL circuit 61 generates an output clock signal CKQ having a frequency obtained by multiplying the frequency of the oscillation signal OSC1. That is, a highly accurate output clock signal CKQ that is phase synchronized with the oscillation signal OSC1 is generated. The PLL circuit 61 includes a phase comparison circuit 62, a control voltage generation circuit 64, a voltage controlled oscillation circuit 66, and a dividing circuit 68.

The phase comparison circuit 62 performs a phase comparison between the oscillation signal OSC1 that is the input clock signal and a feedback clock signal FBCK. For example, the phase comparison circuit 62 compares the phases of the oscillation signal OSC1 and the feedback clock signal FBCK, and outputs a signal CQ corresponding to a phase difference between the oscillation signal OSC1 and the feedback clock signal FBCK as a signal of a phase comparison result. The signal CQ corresponding to the phase difference is, for example, a pulse signal of a pulse width proportional to the phase difference.

The control voltage generation circuit 64 generates a control voltage VC based on the result of the phase comparison obtained from the phase comparison circuit 62. For example, the control voltage generation circuit 64 generates the control voltage VC for controlling the oscillation of the voltage controlled oscillation circuit 66 by performing a charge pump operation or filter processing based on the signal CQ of the phase comparison result from the phase comparison circuit 62.

A voltage controlled oscillation circuit 66 that is a voltage controlled oscillator (VCO) generates an output clock signal CKQ having a frequency corresponding to the control voltage VC. For example, an oscillation operation is performed based on the control voltage VC from the control voltage generation circuit 64 to generate the output clock signal CKQ. For example, the voltage controlled oscillation circuit 66 generates an output clock signal CKQ having a frequency that changes according to the control voltage VC by the oscillation operation. As an example, the voltage controlled oscillation circuit 66 has a variable capacitance element such as a varactor. By changing the capacitance of the variable capacitance element based on the control voltage VC, the frequency of the output clock signal CKQ that is an oscillation signal generated by the oscillation operation of the voltage controlled oscillation circuit 66 is changed. As the voltage controlled oscillation circuit 66, for example, an LC oscillation circuit using an inductor can be used.

The dividing circuit 68 divides the output clock signal CKQ and outputs a feedback clock signal FBCK. For example, the dividing circuit 68 outputs a signal having a frequency obtained by dividing the frequency of the output clock signal CKQ by the division ratio set by division ratio setting data SDIV as a feedback clock signal FBCK. For example, when the frequency of oscillation of the voltage controlled oscillation circuit 66 is set to fvco and the division ratio of dividing operation of the dividing circuit 68 is set to DIV, the frequency of the feedback clock signal FBCK becomes fvco/DIV. Then, as described above, the phase comparison circuit 62 performs a phase comparison between the oscillation signal OSC1 and the feedback clock signal FBCK from the dividing circuit 68.

By using the PLL circuit 61 having a configuration including the phase comparison circuit 62, the control voltage generation circuit 64, the voltage controlled oscillation circuit 66, and the dividing circuit 68, the output clock signal CKQ which is phase synchronized with the oscillation signal OSC1 is generated, and a highly accurate clock signal CK based on the output clock signal CKQ can be generated and output.

The processing circuit 30 includes a time digital conversion circuit 32, a calculation circuit 50, a register 52, an adder 54, and a delta sigma modulation circuit 56. The calculation circuit 50 outputs the temperature compensation data TCP by performing processing based on the information on the learned model with respect to the input data DIN from the time digital conversion circuit 32. The adder 54 adds the temperature compensation data TCP to the reference division ratio data DIVR set in the register 52, and outputs addition result data DIVA to the delta sigma modulation circuit 56. The delta sigma modulation circuit 56 performs a delta sigma modulation with respect to the addition result data DIVA and outputs the division ratio setting data SDIV for setting the division ratio of the dividing circuit 68. By performing delta sigma modulation by the delta sigma modulation circuit 56, the PLL circuit 61 operates as the fractional N-type PLL circuit.

For example, in FIG. 16, the dividing circuit 68 and the delta sigma modulation circuit 56 constitute a fractional divider. The fractional divider divides the output clock signal CKQ using the reciprocal of the multiplication ratio of the PLL circuit 61 as a division ratio, and outputs the divided clock signal to the phase comparison circuit 62 as a feedback clock signal FBCK. The delta sigma modulation circuit 56 performs delta sigma modulation on the value of the fraction part of the division ratio to generate a modulation value that is an integer. For example, the delta sigma modulation circuit 56 performs third-order or fourth-order delta sigma modulation processing. The value of the integer part of the division ratio and the added value of the modulation value are set in the dividing circuit 68 as the division ratio setting data SDIV. As a result, a fractional N-type PLL circuit 61 is realized.

Specifically, the delta sigma modulation circuit 56 performs the delta sigma modulation that integrates and quantizes the fractional division ratio L/M to generate a delta sigma modulation signal. The delta sigma modulation circuit 56 performs a process of adding/subtracting the delta sigma modulation signal and an integer division ratio N, and an output signal after the addition/subtraction is input to the dividing circuit 68. In the output signal after the addition/subtraction, a plurality of integer division ratios in the range near the integer division ratio N change in time series, and the average value of time thereof matches N+L/M. The N+L/M is set by the division ratio setting data SDIV from the processing circuit 30. For example, as described above, the frequency of the output clock signal CKQ is set to fvco, and the phase comparison frequency that is the frequency of the oscillation signal OSC1 and the feedback clock signal FBCK is set to fpfd. In this case, in a normal state in which the phase of the oscillation signal OSC1 that is the reference clock signal and the phase of the feedback clock signal FBCK are synchronized, the relational expression of "fvco= (N+L/M)×fpfd" is established. By using the fractional N-type PLL circuit 61 having such a configuration, an output clock signal CKQ obtained by multiplying the oscillation signal OSC1 by a division ratio represented by N+L/M can be generated.

According to the configuration in FIG. 16, it is possible to realize a fractional divider and realize the temperature compensation processing in which fluctuations in the frequency of the clock signal CK due to the temperature change can be suppressed. In addition, according to the present embodiment, the fractional division processing for realizing the fractional divider and the temperature compensation processing are collectively executed by the digital calculation processing in the processing circuit 30. Therefore, the fractional division processing and the temperature compensation processing can be realized while suppressing an increase in the circuit scale.

Figure 17:
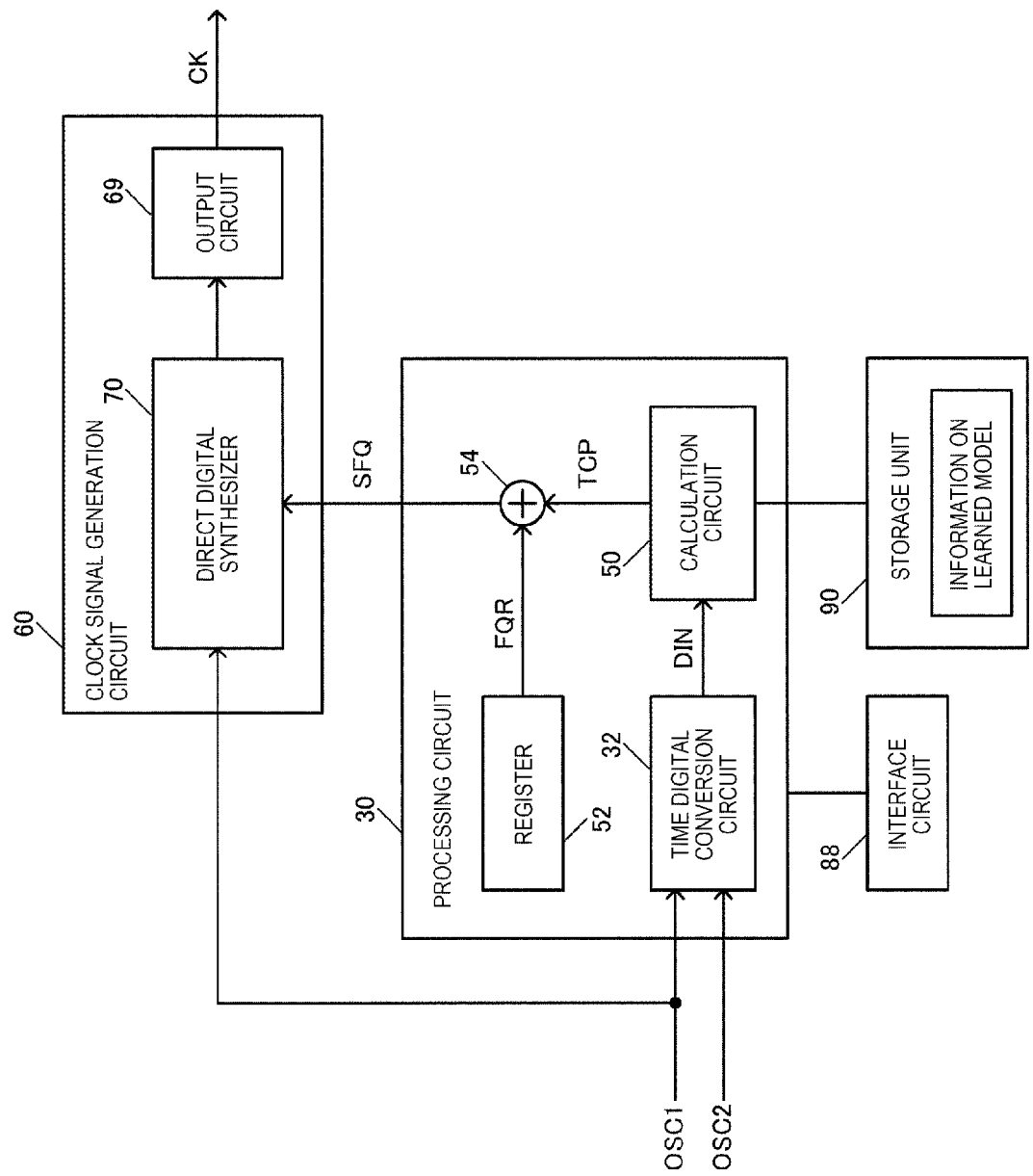
FIG. 17 shows a second configuration example of the clock signal generation circuit.

FIG. 17 shows a second configuration example of the clock signal generation circuit 60. In FIG. 17, the clock signal generation circuit 60 includes a direct digital synthesizer 70. The processing circuit 30 outputs the frequency setting data SFQ corrected by the temperature compensation data TCP to the direct digital synthesizer 70. In this case, the setting data SD in FIG. 3 becomes the frequency setting data SFQ. The direct digital synthesizer 70 generates the clock signal CK with a frequency set by the frequency setting data SFQ using the oscillation signal OSC1 as a reference clock signal. The output circuit 69 outputs the generated clock signal CK to the outside in a signal format such as LVDS, PECL, HCSL, or differential CMOS.

Specifically, the processing circuit 30 includes the time digital conversion circuit 32, the calculation circuit 50, the register 52, and the adder 54. The calculation circuit 50 obtains the temperature compensation data TCP by performing processing based on the information on the learned model with respect to the input data DIN from the time digital conversion circuit 32. Further, the adder 54 adds the temperature compensation data TCP to the reference frequency data FQR set in the register 52, and outputs the frequency setting data SFQ to the direct digital synthesizer 70. The direct digital synthesizer 70 generates a clock signal CK with a frequency set by the frequency setting data SFQ.

The direct digital synthesizer 70 is a circuit that digitally generates a clock signal having any frequency based on a reference clock signal. The reference clock signal is the oscillation signal OSC1. The direct digital synthesizer 70 can include, for example, a phase accumulator that is an integration block and a waveform signal generation circuit. The phase accumulator integrates integration setting values in synchronization with the reference clock signal as an operation for one cycle. The clock frequency is set by the integration setting value. The waveform signal generation circuit can include, for example, a waveform memory and a D/A conversion circuit. The integration result by the phase accumulator becomes an address of the waveform memory, thereby a clock waveform having a clock frequency corresponding to the frequency setting data SFQ is generated.

By using the direct digital synthesizer 70 as shown in FIG. 17, a clock signal CK having any frequency set by the frequency setting data SFQ can be generated. The processing circuit 30 performs the temperature compensation processing for obtaining the temperature compensation data TCP, so that a highly accurate clock signal CK that is temperature compensated can be generated.

Figure 18:
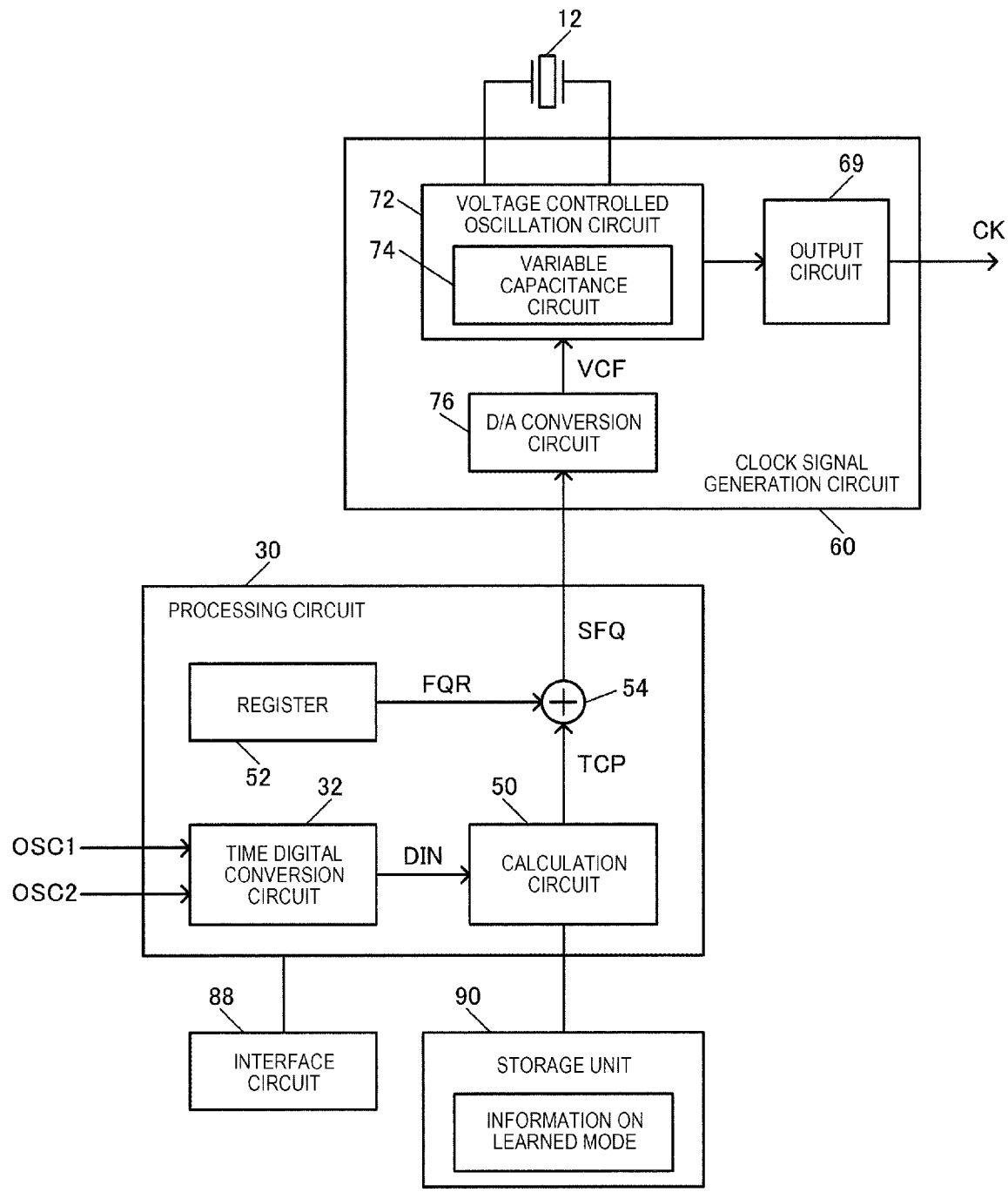
FIG. 18 shows a third configuration example of the clock signal generation circuit.

FIG. 18 shows a third configuration example of the clock signal generation circuit 60. In FIG. 18, the clock signal generation circuit 60 includes a voltage controlled oscillation circuit 72 and a D/A conversion circuit 76. The processing circuit 30 outputs the frequency setting data SFQ corrected by the temperature compensation data TCP. Since the configuration and operation of the processing circuit 30 are the same as those in FIG. 17, the detailed description will be omitted. The D/A conversion circuit 76 D/A converts the frequency setting data SFQ from the processing circuit 30 and outputs a control voltage VCF of the frequency. A voltage controlled oscillation circuit 72 that is a VCO oscillates the resonator 12 at a frequency corresponding to the control voltage VCF from the D/A conversion circuit 76. The resonator is a third resonator. As the resonator 12, the same structure and method as those of the resonators 10 and 11 can be used. As an example, the resonator 12 is a quartz crystal resonator. The voltage controlled oscillation circuit 72 includes a variable capacitance circuit 74 that is electrically coupled to one end of the resonator 12, for example.

The variable capacitance circuit 74 is realized by a variable capacitance element such as a varactor. The capacitance value of the variable capacitance circuit 74 is controlled based on the control voltage VCF. Thereby, the clock signal CK, on which the temperature compensation is performed by the temperature compensation data TCP, is generated. Note that the variable capacitance circuit coupled to the other end of the resonator 12 may be provided. According to the configuration in FIG. 18, the voltage controlled oscillation circuit 72 performs the oscillation operation based on the control voltage VCF corresponding to the frequency setting data SFQ corrected by the temperature compensation data TCP, so that the temperature compensated clock signal CK can be generated.

In FIG. 18, the resonator 12 different from the resonators 10 and 11 is required. A variable capacitance element of the variable capacitance circuit 74 also has frequency-temperature characteristics, and the frequency accuracy of the clock signal CK decreases due to the frequency-temperature characteristics of the variable capacitance element. In this sense, the configuration of FIGS. 16 and 17 is more advantageous than the configuration of FIG. 18. For example, by using the fractional N-type PLL circuit 61, it is possible to generate a highly accurate clock signal CK with less phase noise.

4. Learning Processing

Figure 19:
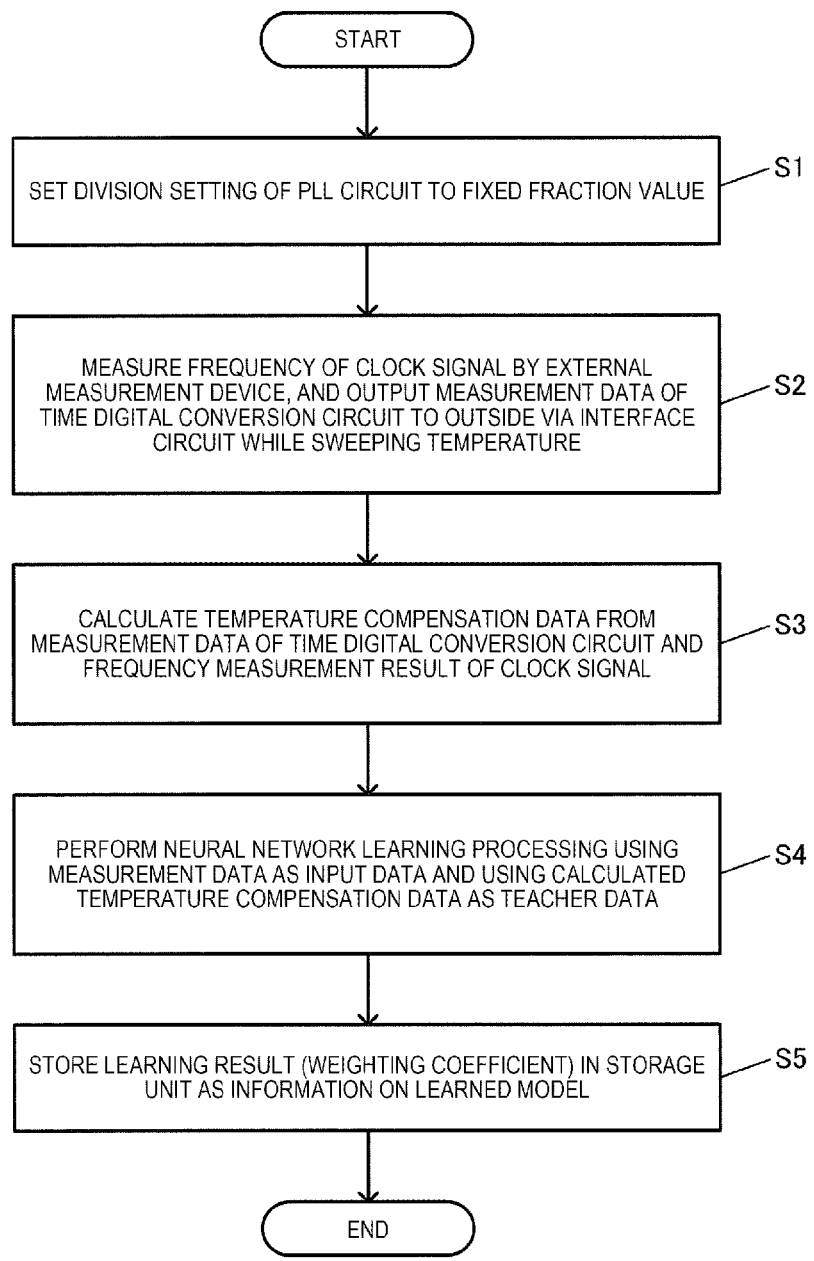
FIG. 19 is a flowchart for explaining an example of learning processing.

Next, the learning processing will be described. FIG. 19 is a flowchart for explaining an example of learning processing. The details of the learning processing will be described using the configuration in FIG. 16 as an example.

First, the division setting of the PLL circuit 61 is set to a fixed fraction value (step S1). For example, the temperature compensation data TCP is set to a fixed value, DIVA is set so as to be a target frequency, and the fractional PLL circuit 61 is operated so as to perform a division with a fixed fractional division. Further, the frequency of the clock signal CK is measured by an external measurement device, and the measurement data of the time digital conversion circuit 32 is output to the outside via the interface circuit 88 while sweeping the temperature (step S2). In FIG. 16, the input data DIN that is measurement data of the time digital conversion circuit 32 is output to the outside via the interface circuit 88.

Next, the temperature compensation data is calculated from the measurement data of the time digital conversion circuit 32 and the frequency measurement result of the clock signal CK (step S3). Then, a neural network learning processing is performed using the measurement data as input data and using the calculated temperature compensation data as teacher data (step S4). The learning result is stored in the storage unit 90 as the information on the learned model (step S5). For example, the weighting coefficient information of the neural network is stored in the storage unit 90 as information on a learned model. Such learning processing shown in FIG. 19 is performed when the oscillator 4 is manufactured or shipped. During the actual operation of the oscillator 4, the processing circuit 30 executes the temperature compensation processing for obtaining the temperature compensation data TCP corresponding to the input data DIN, based on the information on the learned model stored in the storage unit 90.

5. Electronic Apparatus and Vehicle

Figure 20:
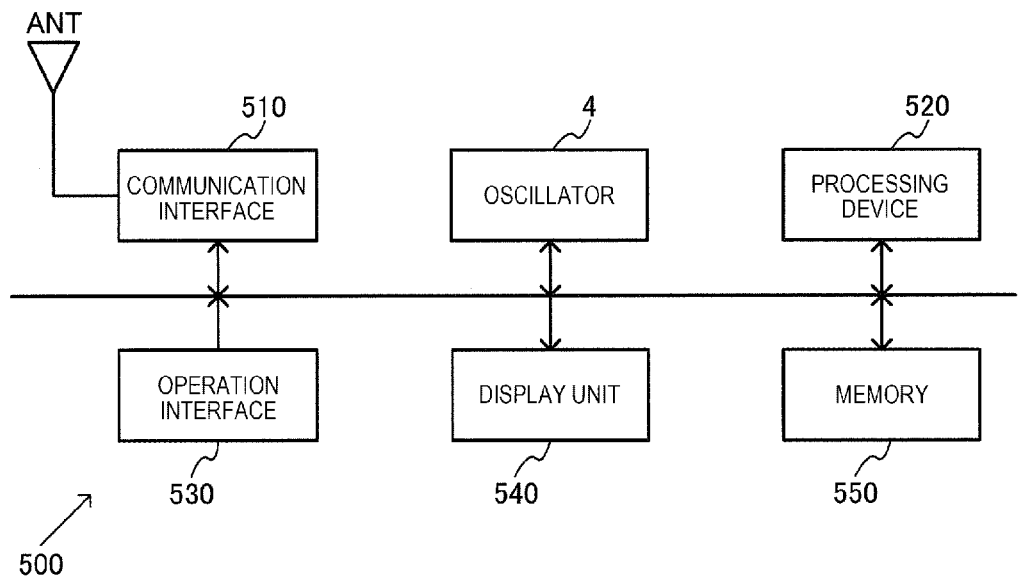
FIG. 20 shows a configuration example of an electronic apparatus.

FIG. 20 shows a configuration example of an electronic apparatus 500 including the oscillator 4 in the present embodiment. The electronic apparatus 500 includes an oscillator 4 and a processing device 520 that operates based on a clock signal CK from the oscillator 4. The electronic apparatus 500 can include an antenna ANT, a communication interface 510, an operation interface 530, a display unit 540, and a memory 550. The electronic apparatus 500 is not limited to the configuration shown in FIG. 20, and various modifications such as omitting some of these components or adding other components are possible.

The electronic apparatus 500 is, for example, a network-related apparatus such as a base station or a router, a high-precision measuring apparatus that measures physical quantities such as distance, time, flow velocity, or flow rate, a biological information measuring apparatus that measures biological information, or an in-vehicle apparatus. The biological information measuring apparatus is, for example, an ultrasonic measuring apparatus, a pulse wave meter, a blood pressure measuring apparatus, or the like. The in-vehicle apparatus is an apparatus for automatic driving or the like. The electronic apparatus 500 may be a wearable apparatus such as a head mounted type display device or a clock related apparatus, a mobile information terminal such as a robot, a printing device, a projection device, a smartphone, a content providing apparatus that delivers content, a video apparatus such as a digital camera or a video camera, or the like.

Further, as the electronic apparatus 500, there is an apparatus used in a next generation mobile communication system such as 5G. For example, the oscillator 4 of the present embodiment can be used in various apparatuses such as a base station, a remote radio head (RRH), or a mobile communication terminal of a next generation mobile communication system. In the next generation mobile communication system, a highly accurate clock frequency is required for time synchronization and the like, which is suitable as an application example of the oscillator 4 of the present embodiment that can generate a highly accurate clock signal.

The communication interface 510 performs processing of receiving data from the outside via the antenna ANT and transmitting data to the outside. The processing device 520 that is a processor performs control processing of the electronic apparatus 500, various digital processing of data transmitted/received via the communication interface 510, or the like. The function of the processing device 520 can be realized, for example, by a processor such as a microcomputer. The operation interface 530 is for a user to perform an input operation, and can be realized by an operation button, a touch panel display, or the like. The display unit 540 displays various types of information and can be realized by a display such as a liquid crystal or an organic EL. The memory 550 stores data, and the function can be realized by a semiconductor memory such as a RAM or a ROM.

Figure 21:
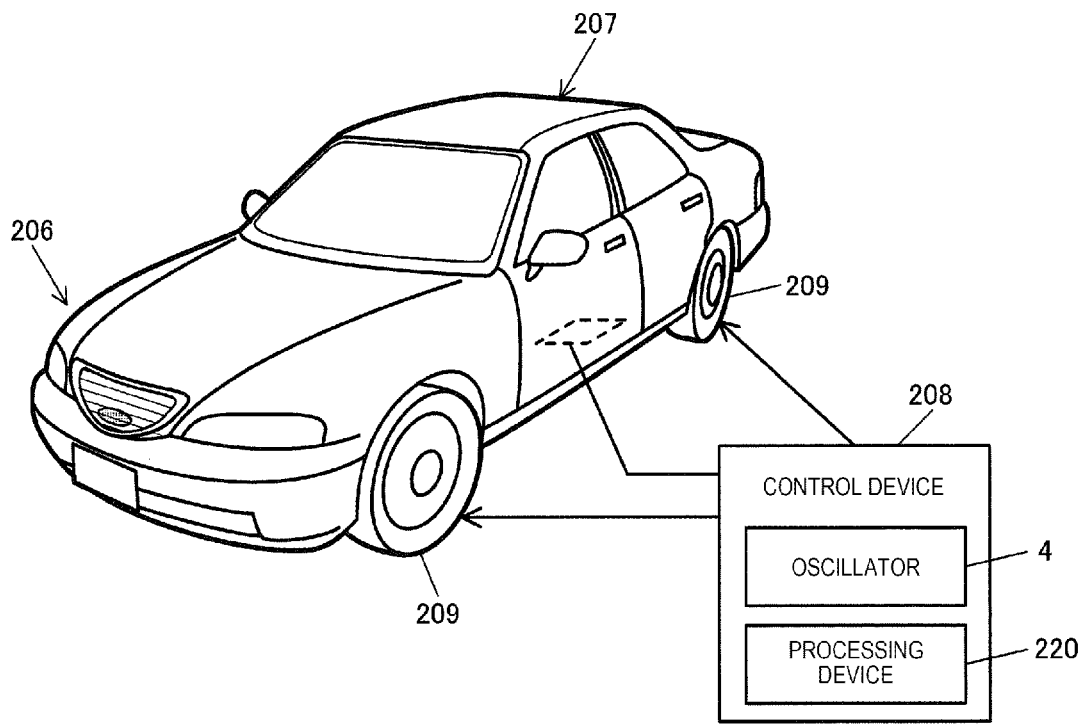
FIG. 21 shows a configuration example of a vehicle.

FIG. 21 shows an example of a vehicle including the oscillator 4 in the present embodiment. The vehicle includes an oscillator 4 and a processing device 220 that operates based on a clock signal CK from the oscillator 4. The oscillator 4 of the present embodiment can be incorporated into various vehicles such as automobiles, airplanes, motorcycles, bicycles, or ships. The vehicle is an apparatus/device that moves on the ground, in the sky, or on the sea, and includes a driving mechanism such as an engine or a motor, a steering mechanism such as a steering wheel or a rudder, and various electronic apparatuses. FIG. 21 schematically shows an automobile 206 as a specific example of the vehicle. In the automobile 206, the oscillator 4 in the present embodiment is incorporated. The control device 208 includes the oscillator 4 and the processing device 220 that operates based on the clock signal CK generated by the oscillator 4. The control device 208, for example, controls the hardness of the suspension according to the posture of a vehicle body 207, and controls brakes of the individual wheels 209. For example, automatic driving of the automobile 206 may be realized by the control device 208. The apparatus in which the oscillator 4 of the present embodiment is incorporated is not limited to such a control device 208, and can be incorporated in various in-vehicle apparatuses such as a meter panel apparatus and a navigation apparatus provided in a vehicle such as the automobile 206.

As described above, the oscillator according to the present embodiment includes a first resonator, a second resonator, a first oscillation circuit generating a first oscillation signal by oscillating the first resonator, a second oscillation circuit generating a second oscillation signal that has frequency-temperature characteristics different from frequency-temperature characteristics of the first oscillation signal by oscillating the second resonator. The oscillator also includes a clock signal generation circuit generating a clock signal with a frequency that is temperature compensated by temperature compensation data, and a processing circuit performing time digital conversion processing based on the first oscillation signal and the second oscillation signal, and obtaining the temperature compensation data based on measurement data of the time digital conversion processing.

According to the present embodiment, the first oscillation signal and the second oscillation signal having different frequency-temperature characteristics with each other are generated by oscillating the first resonator and the second resonator. The processing circuit performs time digital conversion processing based on the first oscillation signal and the second oscillation signal, and obtains the temperature compensation data based on the measurement data of the time digital conversion processing. The clock signal generation circuit generates a clock signal with a frequency that is temperature compensated by the temperature compensation data. In this way, measurement data corresponding to the temperature measurement result can be obtained by performing the time digital conversion processing based on the first oscillation signal and the second oscillation signal having different frequency-temperature characteristics with each other, temperature compensation data corresponding to each temperature is obtained based on the measurement data, and temperature compensation of the clock signal can be realized. Further, the measurement by the time digital conversion processing can shorten the measurement time compared to the measurement by the count processing or the like, so the temperature can be measured with high accuracy in a short time to realize high accurate temperature compensation processing.

In the present embodiment, a storage unit storing information on a learned model that is machine-learned to output data corresponding to the temperature compensation data with respect to input data may be stored, and the processing circuit may obtain the temperature compensation data by performing processing based on the learned model information using the measurement data as the input data.

By using the information on the learned model in this way, more accurate and appropriate temperature compensation data can be obtained, and a highly accurate temperature compensation processing using the learned model can be realized.

In the present embodiment, the processing circuit may include a time digital conversion circuit that receives the first oscillation signal and the second oscillation signal, and performs the time digital conversion processing, and a calculation circuit that receives the measurement data from the time digital conversion circuit as the input data, and obtains the temperature compensation data based on the information on the learned model. Further, the processing circuit may output setting data corrected by the temperature compensation data to the clock signal generation circuit, and the clock signal generation circuit generates the clock signal based on the setting data.

In this way, the temperature compensation data is obtained by performing processing based on the information on the learned model using the measurement data of the time digital conversion circuit as input data, and the temperature compensated clock signal can be generated based on the setting data corrected by the obtained temperature compensation data.

In the present embodiment, the processing circuit may perform first time digital conversion processing for measuring a first time difference between a first edge timing and a second edge timing of the first oscillation signal, perform second time digital conversion processing for measuring a second time difference between a third edge timing and a fourth edge timing of the second oscillation signal, and obtain the temperature compensation data using data corresponding to a difference between the first time difference and the second time difference as the measurement data.

In this way, the temperature compensation data is obtained using the data corresponding to the difference between the first time difference and the second time difference obtained by the first time digital conversion processing and the second time digital conversion processing as the temperature measurement data, and it becomes possible to realize temperature compensation processing of the clock frequency.

In the present embodiment, the processing circuit may perform first time digital conversion processing for measuring a first time difference between a first edge timing and a second edge timing of the first oscillation signal, perform second time digital conversion processing for measuring a second time difference between a third edge timing and a fourth edge timing of the second oscillation signal, and obtain the temperature compensation data using the first time difference data and the second time difference data as the measurement data.

In this way, the temperature compensation data is obtained using the data of the first time difference and the second time difference obtained by the first time digital conversion processing and the second time digital conversion processing as the temperature measurement data, and it becomes possible to realize temperature compensation processing of the clock frequency.

In the present embodiment, the processing circuit may include a first time digital converter that performs the first time digital conversion processing, and a second time digital converter that performs the second time digital conversion processing.

In this way, the first time digital conversion processing and the second time digital conversion processing can be executed in parallel, and high-speed time digital conversion processing can be realized.

In the present embodiment, the processing circuit may execute the first time digital conversion processing and the second time digital conversion processing in a time division manner.

In this way, the first time digital conversion processing and the second time digital conversion processing can be executed by one time digital converter, for example, and the circuit scale of the processing circuit can be reduced.

In the present embodiment, the processing circuit may perform third time digital conversion processing for measuring a third time difference between a first edge timing of the first oscillation signal and a third edge timing of the second oscillation signal, perform fourth time digital conversion processing for measuring a fourth time difference between a second edge timing of the first oscillation signal and a fourth edge timing of the second oscillation signal, and obtain the temperature compensation data using data corresponding to a difference between the third time difference and the fourth time difference as the measurement data.

In this way, the temperature compensation data is obtained using the data corresponding to the difference between the third time difference and the fourth time difference obtained by the third time digital conversion processing and the fourth time digital conversion processing as the temperature measurement data, and it becomes possible to realize temperature compensation processing of the clock frequency.

In the present embodiment, the processing circuit may perform third time digital conversion processing for measuring a third time difference between a first edge timing of the first oscillation signal and a third edge timing of the second oscillation signal, perform a fourth time digital conversion processing for measuring fourth time difference between a second edge timing of the first oscillation signal and a fourth edge timing of the second oscillation signal, and obtain the temperature compensation data using the third time difference data and the fourth time difference data as the measurement data.

In this way, the temperature compensation data is obtained using the data of the third time difference and the fourth time difference obtained by the third time digital conversion processing and the fourth time digital conversion processing as the temperature measurement data, and it becomes possible to realize temperature compensation processing of the clock frequency.

In the present embodiment, the clock signal generation circuit may include a fractional N-type PLL circuit, and the processing circuit may output division ratio setting data corrected by the temperature compensation data to a dividing circuit included in the PLL circuit.

By using the PLL circuit having such a configuration, a PLL circuit output clock signal which is phase synchronized with the first oscillation signal can be generated, and a highly accurate clock signal based on the output clock signal can be generated.

In the present embodiment, the clock signal generation circuit may include a direct digital synthesizer, and the processing circuit may output frequency setting data corrected by the temperature compensation data to the direct digital synthesizer.

By using such a direct digital synthesizer, the clock signal having any frequency set by the frequency setting data can be generated. By using the frequency setting data corrected by the temperature compensation data, it becomes possible to generate a temperature compensated highly accurate clock signal.

In the present embodiment, the clock signal generation circuit may include a D/A conversion circuit that D/A converts frequency setting data and outputs a control voltage of a frequency and a voltage controlled oscillation circuit that oscillates based on the control voltage from the D/A conversion circuit, and the processing circuit may output the frequency setting data corrected by the temperature compensation data to the D/A conversion circuit.

In this way, the frequency setting data corrected by the temperature compensation data is D/A converted, and it becomes possible to generate a temperature compensated clock signal by oscillating the third resonator at a frequency corresponding to the control voltage obtained by the D/A conversion.

The present embodiment relates to an electronic apparatus including the oscillator described above and a processing device that operates based on the clock signal from the oscillator.

Further, the present embodiment relates to a vehicle including the oscillator described above and a processing device that operates based on the clock signal from the oscillator.

Although the present embodiment has been described in detail as described above, it will be easily understood by those skilled in the art that many modifications can be made without departing from the novel matters and effects of the present disclosure. Accordingly, all such modifications are intended to be included within the scope of the present disclosure. For example, a term described at least once together with a different term having a broader meaning or the same meaning in the specification or the drawings can be replaced with the different term in any part of the specification or the drawings. All combinations of the present embodiment and the modification examples are also included in the scope of the present disclosure. Further, the configurations and operations and the like of the oscillator, the resonator, the first oscillation circuit, the second oscillation circuit, the processing circuit, the clock signal generation circuit, the time digital conversion circuit, the electronic apparatus, and the vehicle are described in the present embodiment, but the present disclosure is not limited to this, and various modifications can be made.

What is claimed is:

1. An oscillator comprising:
    a first resonator;
    a second resonator;
    a first oscillation circuit generating a first oscillation signal by oscillating the first resonator;
    a second oscillation circuit generating a second oscillation signal that has frequency-temperature characteristics different from frequency-temperature characteristics of the first oscillation signal by oscillating the second resonator;
    a clock signal generation circuit generating a clock signal with a frequency that is temperature compensated by temperature compensation data; and
    a processing circuit performing time digital conversion processing based on the first oscillation signal and the second oscillation signal, and obtaining the temperature compensation data based on measurement data of the time digital conversion processing,
    wherein the processing circuit
        performs first time digital conversion processing for measuring a first time difference between a first edge timing and a second edge timing of the first oscillation signal,
        performs second time digital conversion processing for measuring a second time difference between a third edge timing and a fourth edge timing of the second oscillation signal, and
        obtains the temperature compensation data using data corresponding to a difference between the first time difference and the second time difference as the measurement data.

2. The oscillator according to claim 1, further comprising:
a storage unit storing information on a learned model that is machine-learned to output data corresponding to the temperature compensation data with respect to input data, wherein
the processing circuit obtains the temperature compensation data by performing processing based on the information on the learned model using the measurement data as the input data.

3. The oscillator according to claim 2, wherein the processing circuit includes
a time digital conversion circuit that receives the first oscillation signal and the second oscillation signal, and performs the time digital conversion processing, and
a calculation circuit that receives the measurement data from the time digital conversion circuit as the input data, and obtains the temperature compensation data based on the information on the learned model,
the processing circuit outputs setting data corrected by the temperature compensation data to the clock signal generation circuit, and
the clock signal generation circuit generates the clock signal based on the setting data.

4. The oscillator according to claim 1, wherein
the processing circuit includes
a first time digital converter that performs the first time digital conversion processing, and
a second time digital converter that performs the second time digital conversion processing.

5. The oscillator according to claim 1, wherein
the processing circuit executes the first time digital conversion processing and the second time digital conversion processing in a time division manner.

6. The oscillator according to claim 1, wherein
the clock signal generation circuit includes a fractional N-type PLL circuit, and
the processing circuit outputs division ratio setting data corrected by the temperature compensation data to a dividing circuit included in the PLL circuit.

7. The oscillator according to claim 1, wherein
the clock signal generation circuit includes a direct digital synthesizer, and
the processing circuit outputs frequency setting data corrected by the temperature compensation data to the direct digital synthesizer.

8. The oscillator according to claim 1, wherein
the clock signal generation circuit includes
a D/A conversion circuit that D/A converts frequency setting data and outputs a control voltage of a frequency, and
a voltage controlled oscillation circuit that oscillates based on the control voltage from the D/A conversion circuit, and
the processing circuit outputs the frequency setting data corrected by the temperature compensation data to the D/A conversion circuit.

9. An electronic apparatus comprising:
the oscillator according to claim 1; and
a processing device that operates based on the clock signal from the oscillator.

10. A vehicle comprising:
the oscillator according to claim 1; and
a processing device that operates based on the clock signal from the oscillator.

11. An oscillator comprising:
a first resonator;
a second resonator;
a first oscillation circuit generating a first oscillation signal by oscillating the first resonator;
a second oscillation circuit generating a second oscillation signal that has frequency-temperature characteristics different from frequency-temperature characteristics of the first oscillation signal by oscillating the second resonator;
a clock signal generation circuit generating a clock signal with a frequency that is temperature compensated by temperature compensation data; and
a processing circuit performing time digital conversion processing based on the first oscillation signal and the second oscillation signal, and obtaining the temperature compensation data based on measurement data of the time digital conversion processing,
wherein the processing circuit
performs first time digital conversion processing for measuring a first time difference between a first edge timing and a second edge timing of the first oscillation signal,
performs second time digital conversion processing for measuring a second time difference between a third edge timing and a fourth edge timing of the second oscillation signal, and
obtains the temperature compensation data using the first time difference data and the second time difference data as the measurement data.

* * * * *